US007532994B2

(12) United States Patent
Tada et al.

(10) Patent No.: US 7,532,994 B2
(45) Date of Patent: May 12, 2009

(54) TEST APPARATUS, TEST METHOD, ELECTRONIC DEVICE MANUFACTURING METHOD, TEST SIMULATOR AND TEST SIMULATION METHOD

(75) Inventors: Hideki Tada, Tokyo (JP); Mitsuo Hori, Tokyo (JP); Takahiro Kataoka, Tokyo (JP); Hiroyuki Sekiguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 22 days.

(21) Appl. No.: 11/395,094

(22) Filed: Mar. 31, 2006

(65) Prior Publication Data

US 2006/0247882 A1 Nov. 2, 2006

Related U.S. Application Data

(63) Continuation of application No. PCT/JP2006/304334, filed on Mar. 7, 2006.

(30) Foreign Application Priority Data

Mar. 7, 2005 (JP) .............................. 2005-062044

(51) Int. Cl.
*G01R 27/28* (2006.01)
(52) U.S. Cl. ..................... 702/117; 702/118; 702/119
(58) Field of Classification Search .......... 702/117–119
See application file for complete search history.

(56) References Cited

U.S. PATENT DOCUMENTS 6,339,555 B1 * 1/2002 Hamada et al. ............. 365/201
2005/0039079 A1   2/2005 Higashi et al.

FOREIGN PATENT DOCUMENTS

| JP | 6324118 | 11/1994 |
|---|---|---|
| JP | 2000-9809 | 1/2000 |
| JP | 2000-147062 | 5/2000 |
| JP | 2001-51025 | 2/2001 |
| JP | 2001255357 | 9/2001 |
| JP | 2002-25294 | 1/2002 |

(Continued)

OTHER PUBLICATIONS

International Search Report for Japanese Application No. PCT/JP2006/304334 mailed Jun. 13, 2006 (7 pages).

(Continued)

*Primary Examiner*—Bryan Bui
*Assistant Examiner*—Stephen J Cherry
(74) *Attorney, Agent, or Firm*—Osha • Liang LLP

(57) ABSTRACT

A test apparatus for testing an electronic device by providing test signals to the electronic device and comparing multiple output signals with respective anticipated values is disclosed, the test apparatus including: a reference timing detecting unit for detecting that one of the output signals has changed; a setting unit for setting beforehand a minimum time from changing of the output signal to changing of another output signal; an acquisition unit for acquiring the value of the latter output signal at a timing at which the minimum time has elapsed from detection of change of the former output signal; and a determination unit for determining the electronic device to be defective in the event that the value of the latter output signal thus acquired does not match the value which the latter output signal should assume following elapsing of the minimum time.

29 Claims, 13 Drawing Sheets

FOREIGN PATENT DOCUMENTS

| | | |
|---|---|---|
| JP | 2002-42498 | 2/2002 |
| JP | 2002-215712 | 8/2002 |
| JP | 2003-161767 | 6/2003 |
| JP | 2004-125574 | 4/2004 |
| JP | 2004-272312 | 9/2004 |
| WO | 2006019081 | 2/2006 |

OTHER PUBLICATIONS

Partial Translation of International Search Report for Japanese Application No. PCT/JP2006/304334 mailed on Jun. 13, 2006 (2 pages).

Patent Abstracts of Japan, Publication No. 2002-215712, Publication Date: Aug. 2, 2002, 2 pages.

Patent Abstracts of Japan for Publication No. 6-324118 dated Nov. 25, 1994, 1 page.

Patent Abstracts of Japan for Publication No. 2001-255357 dated Sep. 21, 2001, 1 page.

Extended European Search Report dated Dec. 8, 2008 issued in EP Application No. 06728703.7 (7 pages).

* cited by examiner

TEST APPARATUS, TEST METHOD, ELECTRONIC DEVICE MANUFACTURING METHOD, TEST SIMULATOR AND TEST SIMULATION METHOD

CROSS REFERENCE TO RELATED APPLICATION

This is a continuation application of PCT/JP2006/304334 filed on Mar. 7, 2006 which claims priority from a Japanese Patent Application NO. 2005-062044 filed on Mar. 7, 2005, the contents of which are incorporated herein by reference.

BACKGROUND OF THE INVENTION

1. Field of the Invention

The present invention relates to a test apparatus, a test method, manufacturing method for electronic devices, a test simulator, and a test simulating method. In particular, the present invention relates to a test apparatus, a test method, a manufacturing a method for electronic devices, a test simulator, and a test simulating method, which employ an electric potential comparator having a function of detecting the magnitude correlation between the electric potential difference between a pair of signals forming a differential signal output from a test subject, and a predetermined threshold electric potential.

2. Related Art

There are known conventional test apparatuss for testing the properties of an electronic circuit and so forth. Specifically, with such a test apparatus, an electric potential comparator compares an electric signal output from an electronic circuit which is a test subject with a predetermined threshold voltage. Thus, the test apparatus has a function of determining the acceptability of the electric circuit, and so forth, based on the comparison results. Accordingly, the reliability of the test with such a test apparatus is greatly dependent upon the comparison precision of the electric potential comparator which is a component for making electric-potential comparison. This means that the electronic potential comparator serves as a critical component of the test apparatus from the perspective of reliability and so forth.

On the other hand, a technique using a so-called differential transmission method has been proposed instead of a conventional technique using a single-end transmission method, in order to improve transmission speed, noise-proof property, and so forth. With the differential transmission method, a signal is transmitted via a pair of transmission lines. Specifically, determination is made whether the signal is "High" or "Low" based on the electric potential difference between a pair of electric signals transmitted via a pair of transmission lines. As electronic circuits employing such a differential transmission method is becoming widespread, there is a demand for a test apparatus including an electric potential comparator that supports the differential transmission method in the field of the test apparatuss for testing the properties of the electronic circuits and so forth. Japanese Unexamined Patent Application Publication No. 2002-215712, for example.

However, with conventional test apparatuss and test simulators, even in a case that an electronic device or a device simulator simulating the electronic device outputs multiple output signals, these output signals are tested independent of one another. Accordingly, in a case that there is correlation in the timing at which the multiple output signals change, the electronic device cannot be tested for determining the acceptability thereof, based on this correlation.

SUMMARY OF THE INVENTION

Accordingly, it is an object of the present invention to provide a test apparatus, a test method, a manufacturing method for electronic devices, test simulator, and a test simulating method, which have a function of solving the aforementioned problems. This object is achieved by combining the features described in the independent claims in the Claims. Also, the dependent claims lay forth further advantageous specific examples of the present invention.

That is to say, according to a first aspect of the present invention, a test apparatus which tests whether or not an electronic device performs expected operations, by providing test signals to the electronic device and comparing multiple output signals output from the electronic device corresponding to the test signals with respective anticipated values, comprises: reference timing detecting means for detecting that one of the output signals has changed; setting means for setting beforehand a minimum time from changing of the output signal to changing of another output signal; acquisition means for acquiring the value of the latter output signal at a timing at which the minimum time has elapsed from detection of change of the former output signal by the reference timing detecting means; and determination means for determining the electronic device to be defective in the event that the value of the latter output signal acquired by the acquisition means does not match the value which the latter output signal should assume following elapsing of the minimum time.

The acquisition means may Airier comprise: strobe generating means for generating a strobe signal at a timing at which the minimum time has elapsed from detection of change of the former output signal by the reference timing detecting means; and a comparator for acquiring the latter output signal according to the strobe signal. The test apparatus may further comprise anticipated value holding means for holding beforehand, as the anticipated value, a value which the latter output signal should assume following elapsing of the minimum time from the changing of the former output signal. The minimum time may be either the setup time of the former output signal for another electronic device which receives the output signals from the electronic device and operates, or the hold time of the latter output signal.

Also, according to a second aspect of the present invention, a test method for testing whether or not an electronic device performs expected operations, by providing test signals to the electronic device and comparing multiple output signals output from the electronic device corresponding to the test signals with respective anticipated values, comprises: a reference timing detecting step for detecting that one of the output signals has changed; a setting step for setting beforehand a minimum time from changing of the output signal to changing of another output signal; an acquisition step for acquiring the value of the latter output signal at a timing at which the minimum time has elapsed from detection of change of the former output signal in the reference timing detecting step; and a determination step for determining the electronic device to be defective in the event that the value of the latter output signal acquired in the acquisition step does not match the value which the latter output signal should assume following elapsing of the minimum time.

Also, according to a third aspect of the present invention, a manufacturing method of an electronic device wherein electronic devices performing expected operations are selectively manufactured, by providing test signals to the electronic device and comparing multiple output signals output from the electronic device corresponding to the test signals with respective anticipated values, comprises: a reference timing detecting step for detecting that one of the output signals has changed; a setting step for setting beforehand a minimum time from changing of the output signal to changing of another output signal; an acquisition step for acquiring the value of the latter output signal at a timing at which the minimum time has elapsed from detection of change of the former output signal in the reference timing detecting step; and a determination step for determining the electronic device to be defective in the event that the value of the latter output signal acquired in the acquisition step does not match the value which the latter output signal should assume following elapsing of the minimum time.

Also, according to a fourth aspect of the present invention, a test simulator which tests whether or not an electronic device performs expected operations, by providing test signals to a device simulator which simulates the operations of an electronic device and comparing multiple output signals output from the device simulator corresponding to the test signals with respective anticipated values, comprises: reference timing detecting means for detecting that one of the output signals has changed; setting means for setting beforehand a minimum time from changing of the output signal to changing of another output signal; acquisition means for acquiring the value of the latter output signal at a timing at which the minimum time has elapsed from detection of change of the former output signal by the reference timing detecting means; and determination means for determining the electronic device to be defective in the event that the value of the latter output signal acquired by the acquisition means does not match the value which the latter output signal should assume following elapsing of the minimum time.

Also, according to a fifth aspect of the present invention, a test apparatus which tests whether or not an electronic device performs expected operations, by providing test signals to the electronic device and comparing multiple output signals output from the electronic device corresponding to the test signals with respective anticipated values, comprises: reference timing detecting means for detecting that one of the output signals has changed; setting means for setting beforehand a minimum time from changing of the output signal to changing of another output signal; elapsed time detecting means for detecting the elapsed time from the reference timing detecting means detecting change in the former output signal to the latter output signal changing; and determination means for determining the electronic device to be defective in the event that the elapsed time is shorter than the minimum time.

Also, according to a sixth aspect of the present invention, a test method which tests whether or not an electronic device performs expected operations, by providing test signals to the electronic device and comparing multiple output signals output from the electronic device corresponding to the test signals with respective anticipated values, comprises: a reference timing detecting step for detecting that one of the output signals has changed; a setting step for setting beforehand a minimum time from changing of the output signal to changing of another output signal; an elapsed time detecting step for detecting the elapsed time from change in the former output signal being detected in the reference timing detecting step to the latter output signal changing; and a determination step for determining the electronic device to be defective in the event that the elapsed time is shorter than the minimum time.

Also, according to a seventh aspect of the present invention, a manufacturing method of an electronic device wherein electronic devices performing expected operations are selectively manufactured, by providing test signals to the electronic device and comparing multiple output signals output from the electronic device corresponding to the test signals with respective anticipated values, comprises: a reference timing detecting step for detecting that one of the output signals has changed; a setting step for setting beforehand a minimum time from changing of the output signal to changing of another output signal; an elapsed time detecting step for detecting the elapsed time from change in the former output signal being detected in the reference timing detecting step to the latter output signal changing; and a determination step for determining the electronic device to be defective in the event that the elapsed time is shorter than the minimum time.

Also, according to an eighth aspect of the present invention, a test simulator which tests whether or not an electronic device performs expected operations, by providing test signals to a device simulator which simulates the operations of an electronic device and comparing multiple output signals output from the device simulator corresponding to the test signals with respective anticipated values, comprises: reference timing detecting means for detecting that one of the output signals has changed; setting means for setting beforehand a minimum time from changing of the output signal to changing of another output signal; elapsed time detecting means for detecting the elapsed time from the reference tiring detecting means detecting change in the former output signal to the latter output signal changing; and determination means for determining the electronic device to be defective in the event that the elapsed time is shorter than the minimum time.

Also, according to a ninth aspect of the present invention, a test apparatus which tests whether or not an electronic device can be correctly tested, by providing multiple test signals to the electronic device and comparing multiple output signals output from the electronic device corresponding to the multiple test signals with respective anticipated values, comprises: reference ting acquisition means for acquiring the point in time at which one of the output signals has changed; setting means for setting beforehand a minimum time from changing of the output signal to changing of another output signal; test signal detecting means for detecting the value of the latter test signal at the timing at which the minimum time has elapsed from the point in time of the former test signal changing that has been obtained by the reference timing acquisition means; and notification means for determining that the electronic device cannot be correctly tested in the event that the value of the latter test signal detected by the detecting means does not match a value stored beforehand as the value which the latter test signal should assume following elapsing of the minimum time, and making notification to that effect.

Also, according to a tenth aspect of the present invention, a test simulator which tests whether or not an electronic device can be correctly tested, by providing multiple test signals to a device simulator simulating operations of an electronic device, and comparing multiple output signals output from the device simulator corresponding to the multiple test signals with respective anticipated values, comprises: reference timing acquisition means for acquiring the point in time at which one of the output signals has changed; setting means for setting beforehand a minimum time from changing of the output signal to changing of another output signal; test signal detecting means for detecting the value of the latter test signal at the timing at which the minimum time has elapsed from the point in time of the former test signal changing that has been obtained by the reference timing acquisition means; and notification means for determining that the electronic device cannot be correctly tested in the event that the value of the latter test signal detected by the detecting means does not match a value stored beforehand as the value which the latter test signal should assume following elapsing of the minimum time, and making notification to that effect.

Also, according to an eleventh aspect of the present invention, a test simulation method which tests whether or not an electronic device can be correctly tested, by providing multiple test signals to a device simulator simulating operations of an electronic device, and comparing multiple output signals output from the device simulator corresponding to the multiple test signals with respective anticipated values, comprises: a reference timing acquisition step for acquiring the point in time at which one of the output signals has changed; a setting step for setting beforehand a minimum time from changing of the output signal to changing of another output signal; a test signal detecting step for detecting the value of the latter test signal at the timing at which the minimum time has elapsed from the point in time of the former test signal changing that has been obtained in the reference timing acquisition step; and a notification step for determining that the electronic device cannot be correctly tested in the event that the value of the latter test signal detected in the detecting step does not match a value stored beforehand as the value which the latter test signal should assume following elapsing of the minimum time, and making notification to that effect. The simulation method may further comprise a storage step for storing a modified pattern of the test signals following the notification being performed in the notification step; wherein, following the storage step, the reference timing acquisition step and the test signal detecting step are executed again.

Also, according to a twelfth aspect of the present invention, a manufacturing method of an electronic device, wherein whether or not au electronic device can be correctly tested is tested by providing multiple test signals to a device simulator simulating operations of the electronic device, and comparing multiple output signals output from the device simulator corresponding to the multiple test signals with respective anticipated values, an actual electronic device is tested using the pattern of the test signals used for the test, and electronic devices performing expected operations are selectively manufactured, comprises: a reference timing acquisition step for acquiring the point in time at which one of the output signals has changed; a setting step for setting beforehand a minimum time from changing of the output signal to changing of another output signal; a test signal detecting step for detecting the value of the latter test signal at the timing at which the minimum time has elapsed from the point in time of the former test signal changing that has been obtained in the reference timing acquisition step; a notification step for determining that the electronic device cannot be correctly tested in the event that the value of the latter test signal detected in the detecting step does not match a value stored beforehand as the value which the latter test signal should assume following elapsing of the minimum time, and making notification to that effect; a storage step for storing a modified pattern of the test signals following the notification being performed in the notification step; a repetition step wherein, following the storage step, the reference timing acquisition step and the test signal detecting step are executed again; an actual testing step wherein, in the event that the value of the latter test signal detected in the detecting step matches a value stored beforehand as the value which the latter test signal should assume following elapsing of the minimum time, an actual electronic device is tested using the modified test signal pattern; and a determination step for determining the electronic device to be acceptable in the event that the value of the output signal obtained from the electronic device in the actual testing step matches an anticipated value.

Also, according to a thirteenth aspect of the present invention, a test apparatus which tests whether or not an electronic device can be correctly tested, by providing multiple test signals to an electronic device and comparing multiple output signals output from the device simulator corresponding to the multiple test signals with respective anticipated values, comprises: reference timing acquisition means for acquiring the point in time at which one of the output signals has changed; setting means for setting beforehand a minimum time from changing of the output signal to changing of another output signal; elapsed time detecting means for detecting the elapsed time from the reference timing detecting means detecting change in the former output signal to the latter output signal changing; and notification means for determining that the electronic device cannot be correctly tested in the event that the elapsed time is shorter than the minimum time, and making notification to that effect.

Also, according to a fourteenth aspect of the present invention, a test simulator which tests whether or not an electronic device can be correctly tested, by providing multiple test signals to a device simulator simulating the operations of an electronic device and comparing multiple output signals output from the device simulator corresponding to the multiple test signals with respective anticipated values, comprises: reference timing acquisition means for acquiring the point in time at which one of the output signals has changed; setting means for setting beforehand a minimum time from changing of the output signal to changing of another output signal; elapsed time detecting means for detecting the elapsed time from the reference timing acquisition means acquiring change in the former output signal to the latter output signal changing; and notification means for determining that the electronic device cannot be correctly tested in the event that the elapsed time is shorter than the minimum time, and making notification to that effect.

Also, according to a fifteenth aspect of the present invention, a test simulating method which tests whether or not au electronic device can be correctly tested, by providing multiple test signals to a device simulator simulating the operations of an electronic device and comparing multiple output signals output from the device simulator corresponding to the multiple test signals with respective anticipated values, comprises: a reference timing acquisition step for acquiring the point in time at which one of the output signals has changed; a setting step for setting beforehand a minimum time from changing of the output signal to changing of another output signal; an elapsed time detecting step for detecting the elapsed time from change being acquired in the former output signal in the reference timing acquisition step to the latter output signal changing; and a notification step for determining that the electronic device cannot be correctly tested in the event that the elapsed time is shorter than the minimum time, and making notification to that effect.

The simulation method may further comprise a storage step for storing a modified pattern of the test signals following the notification being performed in the notification step; wherein, following the storage step, the reference timing acquisition step and the elapsed time detecting step are executed again.

Also, according to a sixteenth aspect of the present invention, a manufacturing method of an electronic device, wherein whether or not an electronic device can be correctly tested is tested by providing multiple test signals to a device simulator simulating operations of the electronic device, and comparing multiple output signals output from the device simulator corresponding to the multiple test signals with respective anticipated values, an actual electronic device is tested using the pattern of the test signals used for the test, and electronic devices performing expected operations are selectively manufactured, comprises: a reference timing acquisition step for acquiring the point in time at which one of the output signals has changed; a setting step for setting beforehand a minimum time from changing of the output signal to changing of another output signal; an elapsed time detecting step for detecting the elapsed time from changing of the former output signal being acquired in the reference timing acquisition step to the latter output signal changing; a notification step for determining that the electronic device cannot be correctly tested in the event that the elapsed time is shorter than the minimum time, and making notification to that effect; a storage step for storing a modified pattern of the test signals following the notification being performed in the notification step; a repetition step wherein, following the storage step, the reference timing acquisition step and the test signal detecting step are executed again; an actual testing step wherein, in the event that the value of the latter test signal detected in the detecting step matches a value stored beforehand as the value which the latter test signal should assume following elapsing of the minimum time, an actual electronic device is tested using the modified test signal pattern; and a determination step for determining the electronic device to be acceptable in the event that the value of the output signal obtained from the electronic device in the actual testing step matches an anticipated value.

Note that the above overview of the invention is not a comprehensive listing of all essential features of the present invention, and that sub-combinations of these feature groups may also be encompassed by the invention.

According to the present invention, acceptability of an electronic device is determined with higher precision by performing testing regarding correlation of the timing at which multiple output signals output from the electronic device change.

DETAILED DESCRIPTION OF THE INVENTION

The present invention will now be described by way of embodiments; however, it should be understood that the following embodiments do not restrict the invention according to the Claims, and that combinations of features described in the embodiments are not necessarily indispensable to the present invention.

Figure 1:
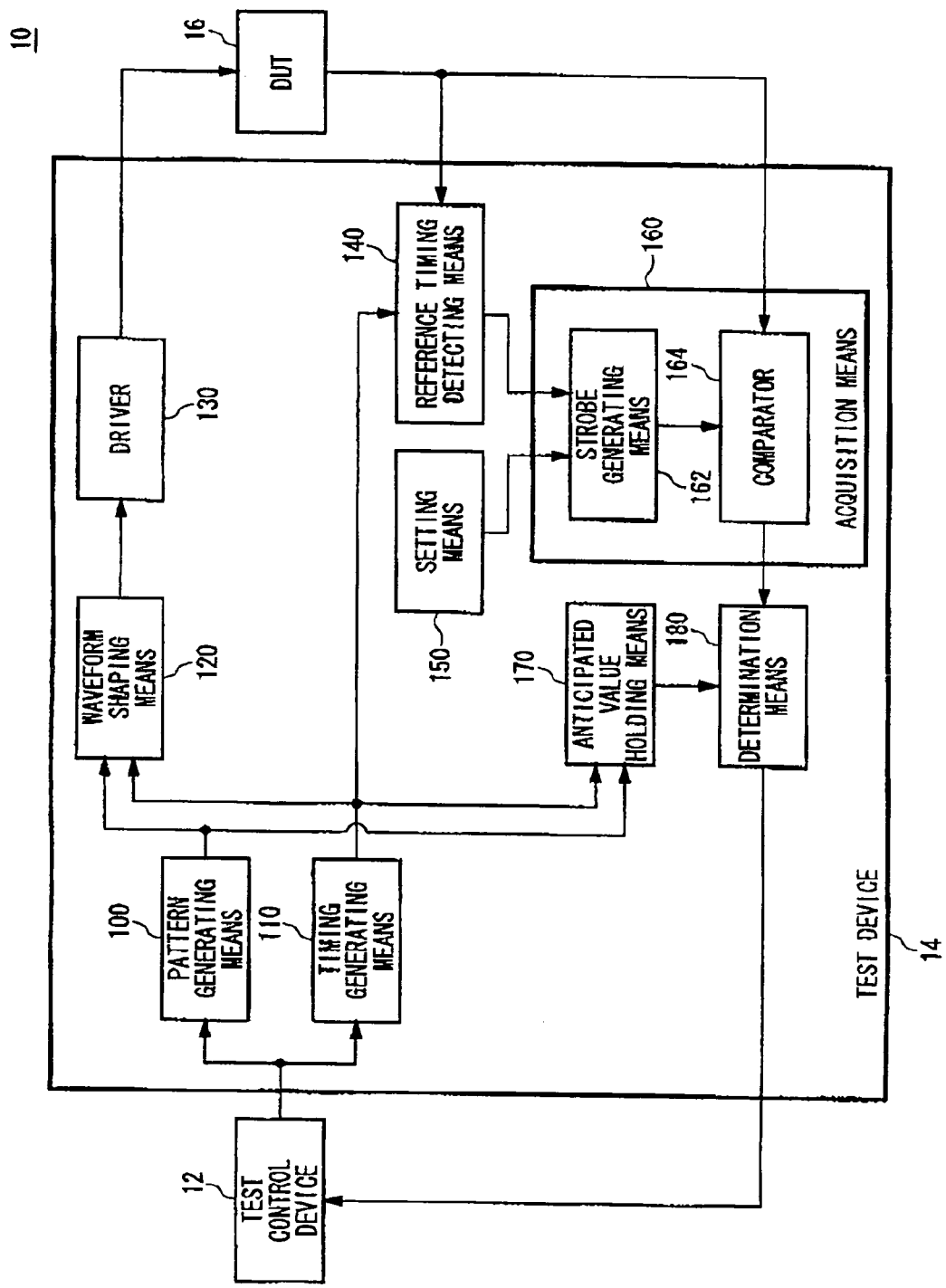
FIG. 1 is a block diagram which shows an example of the functional configuration of a test system 10 according to a first embodiment of the present invention.

FIG. 1 is a block diagram which shows an example of a functional configuration of a test system 10 according to a first embodiment The test system 10 includes a test control device 12, a test apparatus 14, and a DUT (device under test) 16. With the test system 10, the test apparatus 14 tests the DUT 16 which is an electronic device. The test control device 12 instructs the test apparatus 14 to execute a test of the DUT 16. The test apparatus 14 provides test signals to the DUT 16. At the same time, the test apparatus 14 makes a comparison between multiple output signals output from the DUT 16 corresponding to the test signals and anticipated values, thereby determining whether or not the DUT 16 performs expected operation. The DUT 16 generates multiple output signals corresponding to the test signals provided from the test apparatus 14. The multiple output signals are output through multiple pins provided to the DUT 16.

It is an object of the test apparatus 14 according to the first embodiment of the present invention to provide measurement which allows the acceptability of the DUT 16 to be determined with higher precision, by testing correlation in the timing at which the multiple output signals change, as well as testing the DUT 16 by performing processing for comparing each of the multiple output signals output from the DUT 16 with the corresponding anticipated value like a function test using a conventional test apparatus.

Note that the multiple test signals of which the timing of change is correlated, to be described in the present embodiment may be, in a case that the DUT 16 outputs a signal indicating an address for another electronic device such as DRAM or the like for example, an address signal in a case of providing a signal specifying an address as an address signal, a row address strobe signal (RAS signal) indicating the timing of inputting the address value which the address signal indicates as a row address, or a column address strobe signal (CAS signal) indicating the timing of inputting the address value which the address signal indicates as a column address.

The test apparatus 14 includes pattern generating means 100, timing generating means 110, waveform shaping means 120, a driver 130, reference timing detecting means 140, setting means 150, acquisition means 160, anticipated value holding means 170, and determination means 180. The pattern generating means generate a pattern of a test signal, which is to be provided to the DUT 16, under control of the test control device 12. Furthermore, the pattern generating means 100 generate information with respect to the anticipated values of the output signals, which represent the output signals output from the DUT 16 in a case of receiving the test signal. The information thus generated is output to the anticipated value holding means 170. Here, the information indicating the anticipated values may include a value which one output signal of the multiple output signals output from the DUT 16 should assume after another one output signal has changed in a case that there is correlation in the timing at which the output signals change.

The timing generating means 110 generate timing, at which a test signal is to be provided to the DUT 16, under control of the test control device 12. The timing generating means 110 output information indicating the tiring, to the waveform shaping means 120, the reference timing detecting means 140, and the anticipated value holding means 170.

The waveform shaping means 120 form the waveform of a test signal, which is to be provided to the DUT 16, based on the test signal pattern which has been received from the pattern generating means 100, and which is to be provided to the DUT 16, and the information which has been received from the timing generating means 110, and which indicates timing at which the test signal is to be provided to the DUT 16. The driver 130 provides the test signal, which has been received from the waveform shaping means 120, to the DUT 16. Note that the test apparatus 14 may include multiple pin cards corresponding to multiple pins provided to the DUT 16. Furthermore, each pin card may include the driver 130. Such an arrangement allows these multiple pins to receive test signals different from one another. Subsequently, the DUT 16 generates multiple output signals corresponding to the test signal thus provided. The output signals thus generated are output to the reference timing detecting means 140 and the acquisition means 160.

The reference timing detecting means 140 detect the change in one of the multiple output signals output from the DUT 16. For example, an arrangement may be made in which the reference timing detecting means 140 create multiple strobe signals, and acquire one of the output signals according to each of these multiple strobe signals. With such an arrangement, determination is made whether or not the value thus acquired has changed from the previously acquired value, thereby detecting the change in the particular one of these multiple output signals.

Then, the reference timing detecting means 140 output information indicating the timing at which the particular one output signal has changed, to the acquisition means 160. In a case that of the multiple output signals output from the DUT 16, there is correlation between the timing of changing of one test signal and another test signal, the setting means 150 set a minimum time from the point in time at which the former output signal changes to the point in time at which the latter output signal changes, under control of the test control device 12, for example.

Then, the setting means 150 output the information indicating the minimum time thus set, to the acquisition means 160.

The acquisition means 160 include strobe generating means 162 and a comparator 164. The acquisition means 160 acquire the latter output signal value after the minimum time set by the setting means after the reference timing detecting means 140 have detected the change in the former output signal. The strobe generating means 162 generate a strobe signal at a timing after the minimum time thus set after the reference timing detecting means 140 have detected the change in the former output signal. The strobe signal thus generated is output to the comparator 164.

Note that the strobe generating means 162 and the timing generating means 110 may be formed in the form of a single unit The comparator 164 acquires the latter output signal output from the DUT 16, according to the strobe signal generated by the strobe generating means 162. Specifically, an arrangement may be made in which the comparator 164 compares the latter output signal with a reference voltage at a timing indicated by the strobe signal thus generated, and employs the comparison result in the form of a logical value as the latter output signal. Then, the comparator 164 outputs the latter output signal value to the determination means 180.

The anticipated value holding means 170 create the anticipated values of the output signals output from the DUT 16 corresponding to the test signal, based on the information which has been received from the pattern generating means 100, and which indicates the anticipated values, and the timing which has been received from the timing generating means 110, and at which the test signal is to be provided to the DUT 16. The anticipated value holding means 170 hold the created anticipated values beforehand.

Specifically, in a case that of the multiple output signals output from the DUT 16, there is correlation between the timing of changing of one test signal and another test signal, the anticipated value holding means 170 hold, as the anticipated value, the output value which the latter output signal should assume at a timing after the minimum time set by the setting means 150 after the former output signal has changed.

The determination means 180 make a comparison between the output signal acquired by the acquisition means 160 and the anticipated value held by the anticipated value holding means 170, thereby determining the acceptability of the DUT 16. Specifically, in a case that the latter output signal value acquired by the acquisition means 160 does not match the anticipated value which has been stored in the anticipated value holding means 170, and which the latter output signal value should assume after the minimum time set beforehand, the determination means 180 determine that the DUT 16 is defective.

Then, the determination means 180 output the determination result with respect to the acceptability of the DUT 16 to the test control device 12, thereby notifying the user or the like of the determination result.

Description has been made regarding an arrangement in which the test apparatus 14 determines the acceptability of the DUT 16 based on the correlation of the timing at which the multiple output signals change. With the test apparatus 14, an arrangement may be made in which the multiple output signals are compared with the respective anticipated values stored in the anticipated value holding means 170 at predetermined timing in the same way as with a function test executed by a conventional test apparatus, thereby determining the acceptability of the DUT 16.

With the test apparatus 14 according to the first embodiment of the present invention, in a case that there is correlation in the timing at which the multiple output signal change, an electronic device can be tested based on this correlation.

Accordingly, even in the event that the values of the respective output signals at a predetermined timing match the values which they should assume, if the respective test signals do not satisfy a predetermined correlation, i.e., in the event that the value of one output signal, which has been output at a timing for which the preset minimum time has been elapsed from the change in another output signal, does match the anticipated value, determination can be made that the electronic device is defective.

Conversely, even in the event that the values of the respective test signals at the predetermined timing do not match the values which they should assume, determination can be made that the electronic device is acceptable as long as the respective test signals satisfy a predetermined correlation due to the timing of change in the respective test signals having been uniformly shifted.

As described above, the test apparatus 14 offers higher-precision and flexible test of electronic devices, as compared with test apparatuss configured so as to perform only a conventional function test.

Furthermore, with the test apparatus 14, of the multiple output signals, one output signal is acquired at a timing after a minimum time after another output signal changes, according to a strobe signal thus generated. This enables correlation between these output signals to be tested in a sure manner. Furthermore, with the test apparatus 14, the value which the latter output signal should assume is held beforehand as an anticipated value, and the acquired latter output signal is compared with the anticipated value thus held. This enables test to be performed based on the anticipated values for each test signal pattern, even in a case of using various kinds of test signal patterns.

Figure 2:
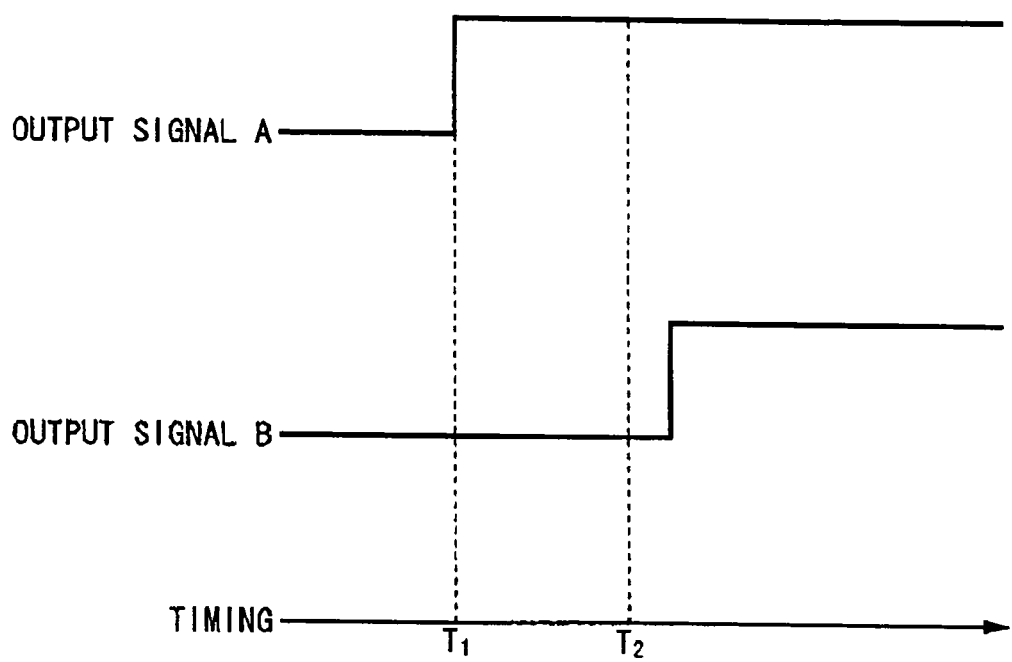
FIG. 2 is a diagram which shows an example of the output signals of a DUT 16 according to the first embodiment of the present invention.

FIG. 2 shows an example of output signals of the DUT 16 according to the first embodiment of the present invention. Of the output signals shown in this drawing, the output signal A represents the former output signal described with reference to FIG. 1. On the other hand, the output signal B represents the latter output signal described with reference to FIG. 1. In this example, there is correlation of timing at which the output signal A and the output signal B change. For example, the output signal B does not change before predetermined minimum time after the output signal A has changed. Here, in this drawing, the timing at which the output signal A changes is represented by the timing T1. On the other hand, the timing after the minimum time set by the setting means after the timing T1 is represented by the point in time T2. The anticipated value held by the anticipated value holding means 170, i.e., the value, which the output signal B should assume at the timing T2, is a low logical value. Accordingly, in a case that the output signal B is set to a high logical value at the timing T2, the determination means 180 determine that the DUT 16 is defective.

Let us consider a case in which the DUT 16, which is an electronic device, provides output signals to another electronic device, and the latter electronic device operates according to the output signals thus received. In such a case, the minimum time may be set to either the setup time for the former output signal, i.e., the output signal A, or the hold time for the latter output signal, i.e., the output signal B.

As a specific example, description will be made regarding a case in which the DUT 16 outputs an address signal, and a RAS signal, which indicates the timing at which the address value indicated by the address signal is to be input as a raw address, to DRAM which is another electronic device. That is to say, the test apparatus 14 tests a function of the DUT 16, which is for outputting the address signal and the RAS signal. In such a case, let us say that the address signal is represented by the output signal A, and the RAS signal is represented by the output signal B. In this case, the minimum time may be the setup time for the output signal A for the latter electronic device. On the other hand, let us say that the RAS signal is represented by the output signal A, and the address signal is represented by the output signal B. In this case, the minimum time may be the hold time for the output signal B for the latter electronic device.

Thus, with the test apparatus 14, determination can be made whether or not the address signal is acquired by the latter electronic device in a sure manner at a timing at which the RAS signal changes. That is to say, determination is made whether or not the latter electronic device performs normal operation according to the output signals output from the DUT 16 which is an electronic device.

Figure 3:
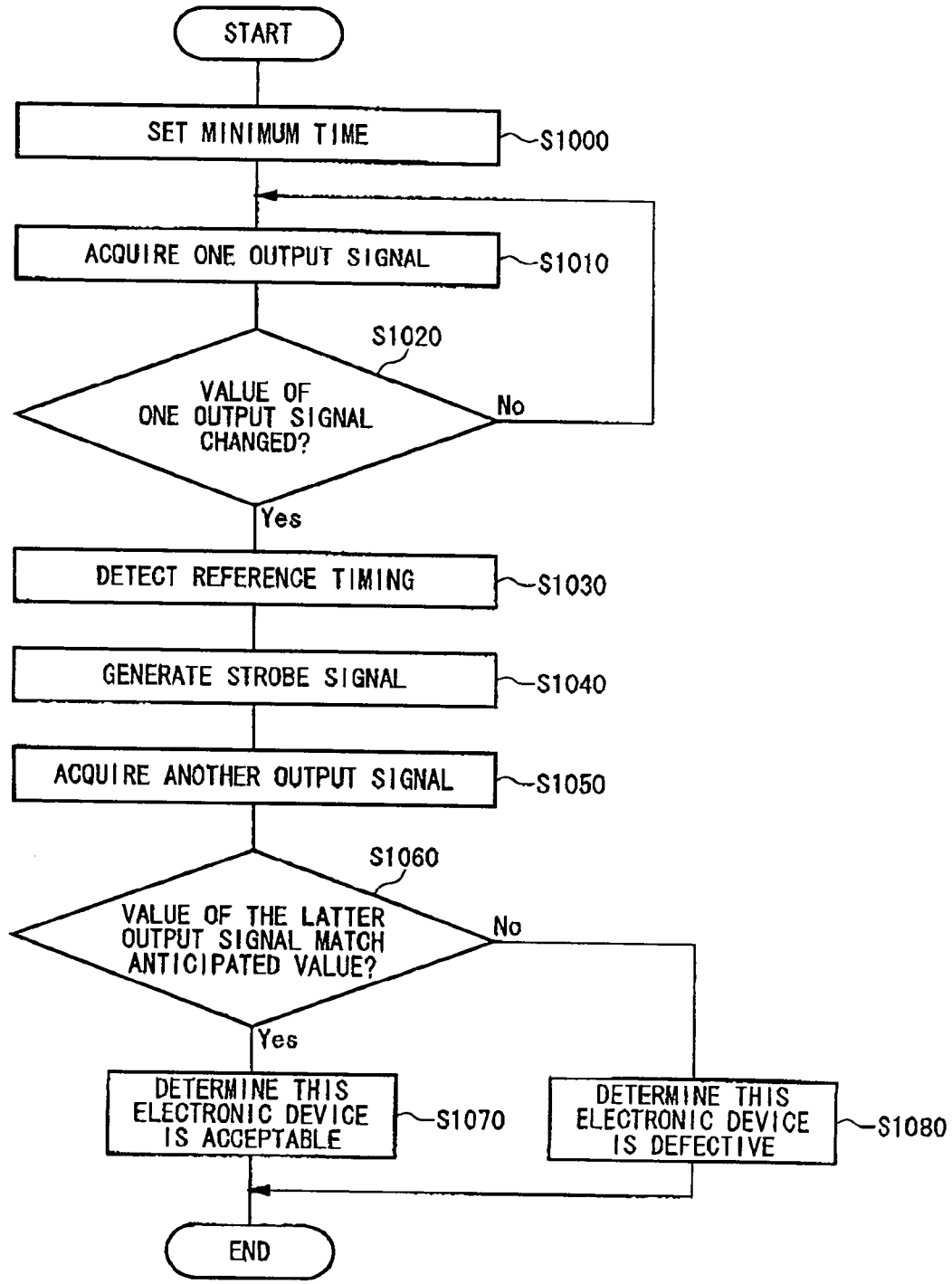
FIG. 3 is a flowchart which shows an example of the flow of processing with a test method for an electronic device using a test apparatus 14 according to the first embodiment of the present invention.

FIG. 3 is a flowchart which shows an example of a flow of the processing with a test method for an electronic device using the test apparatus 14 according to the first embodiment of the present invention. First, the setting means 150 set beforehand the minimum time from the point in time at which one of the multiple output signals output from the DUT 16 changes, up to the point in time at which another output signal changes (S1000). Subsequently, the reference timing detecting means 140 acquire the former output signal from among the multiple output signals output from the DUT 16 according to the test signal (S1010). Then, the reference timing detecting means 140 determine whether or not the former output signal value thus acquired has changed from the value in the previous acquisition (S1020). In a case that the former output signal value has not changed from the previous value (in a case of "NO" in Step S1020), the timing detecting means 140 return the processing to Step S1010, and execute acquisition of the former output signal again.

On the other hand, in a case that the former output signal value has changed from the previous value (in a case of "YES" in Step S1020), the reference timing detecting means 140 detect the timing, at which the former output signal has changed, as a reference timing (S1030).

Then, the strobe generating means 162 generate a strobe signal at a timing after the minimum time thus set, after the reference timing thus detected (S1040). Subsequently, the comparator 164 acquires the latter output signal from among the multiple output signals output from the DUT 160, at a timing indicated by the strobe signal thus generated (S1050). Then, the determination means 180 determine whether or not the latter output signal thus acquired matches the anticipated value held by the anticipated value holding means 170 (S1060). In a case that the latter output signal value matches the anticipated value (in a case of "YES" in Step S1060), the determination means 180 determine that the DUT 160, which is an electronic device, is acceptable (S1070). On the other hand, in a case that the latter output signal value does not match the anticipated value (in a case of "NO" in Step S1060), the determination means 180 determine that the DUT 160, which is an electronic device, is defective (S1080).

With the test method according to the first embodiment of the present invention, in a case that of the multiple output signals output from an electronic device, there is correlation in the timing at which these output signals change, the electronic device is tested based on this correlation. This enables the electronic device to be tested with high precision and more flexibly.

Also, by performing a test of an electronic device following the flow of the processing shown in the drawing, the electronic device can be manufactured with determination of whether or not the electronic device is acceptable or not being made with higher precision and more flexibility.

Figure 4:
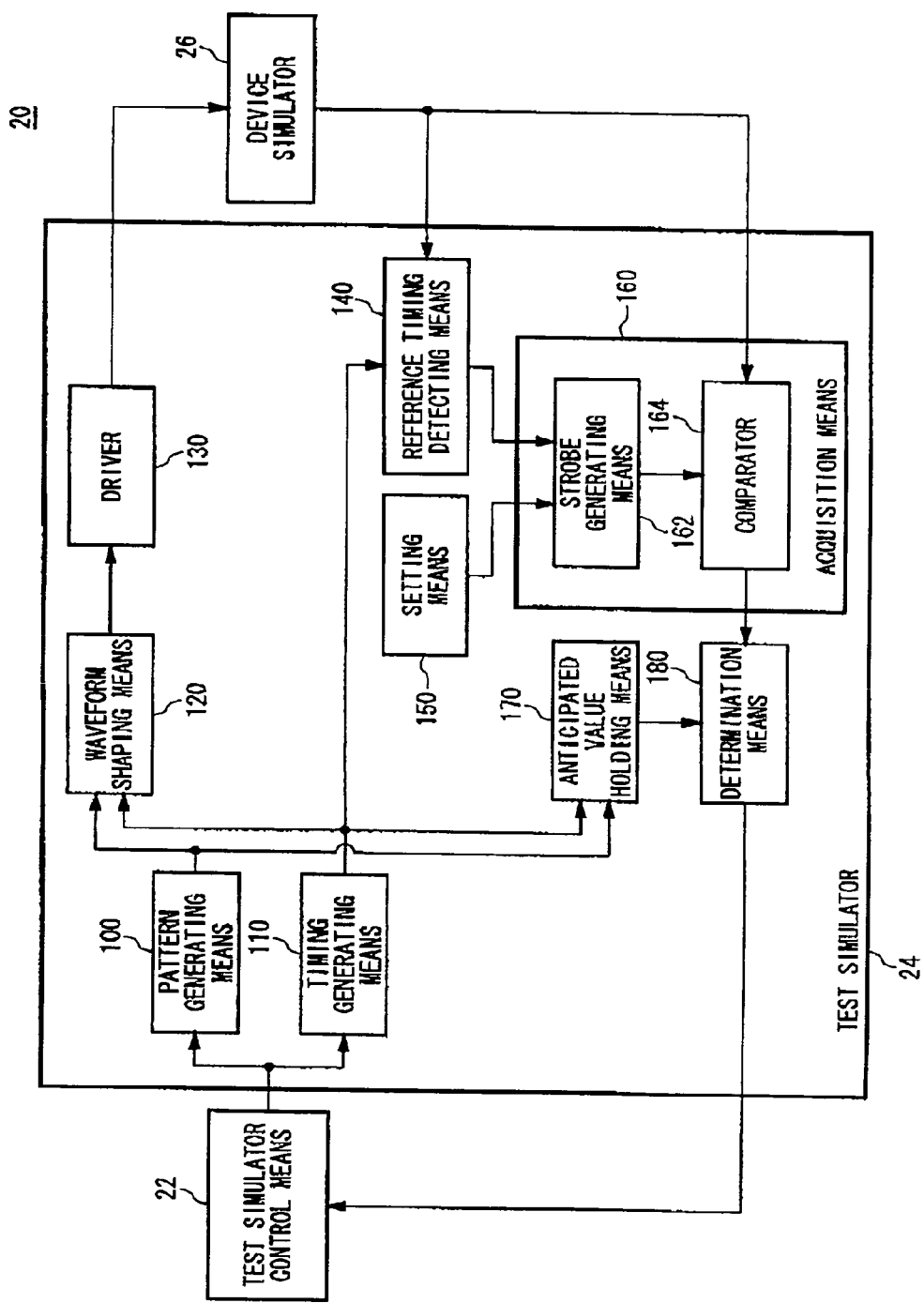
FIG. 4 is a block diagram which shows an example of the functional configuration of a test simulation system 20 according to a second embodiment of the present invention.

FIG. 4 is a block diagram which shows an example of a functional configuration of a test simulation system 20 according to a second embodiment of the present invention The test simulation system 20 includes test simulator control means 22, a test simulator 24, and a device simulator 26. The test simulator 24 simulates in a software manner the operations of the test apparatus 14 according to the first embodiment of the present invention, which has been described with reference to FIG. 1 through FIG. 3.

Specifically, the test simulator 24 provides a test signal to the device simulator 26 for simulating the operations of an electronic device. At the same time, the simulator 24 compares multiple output signals, which are output from the device simulator 26 according to the test signal, with the anticipated values. Thus, the test simulator 24 performs a test for determining whether or not the electronic device performs expected operation.

The test simulator 24 comprises pattern generating means 100, timing generating means 110, waveform shaping means 120, driver 130, reference timing detecting means 140, setting means 150, acquisition means 160, anticipated value holding means 170, and determination means 180. Note that each of these components included in the test simulator 24 shown in this drawing has generally the same function as that of the corresponding component denoted by the same reference numeral, and included in the test apparatus 14 shown in FIG. 1. Accordingly, description thereof will be omitted. Note that each of the components included in the test simulator 24 operates by simulating the corresponding component included in the test apparatus 14 in a software manner.

With the present embodiment, the test simulator 24 is controlled by the test simulator control means 22 instead of the test control device 12. Furthermore, the device simulator 26, which simulates the electronic device by software, is tested instead of testing of the DUT 16 which is an actual electronic device. Thus, the electronic device is tested.

With the test simulator 24 according to the second embodiment of the present invention, in a case that of the multiple output signals output from the device simulator for simulating an electronic device, there is correlation in the timing at which these output signals change, the electronic device can be tested based on this correlation.

This offers a higher-precision and more flexible electric-device simulation test, as compared with a test simulator configured so as to perform only a conventional function test.

Figure 5:
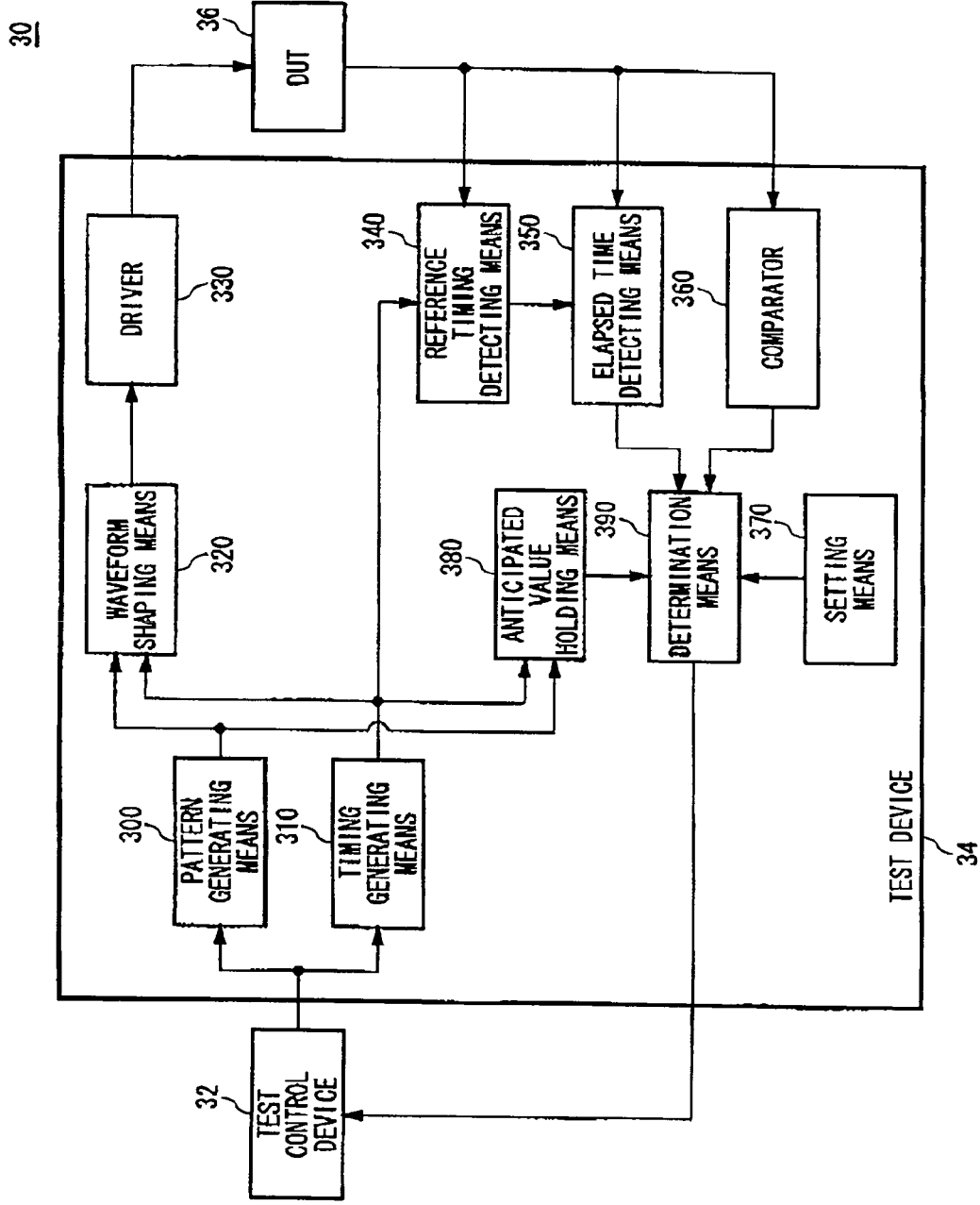
FIG. 5 is a block diagram which shows an example of the configuration of a test system 30 according to a third embodiment of the present invention.

FIG. 5 is a block diagram which shows an example of a configuration of a test system 30 according to a third embodiment of the present invention. The test system 30 comprises a test control device 32, a test apparatus 34, and a DUT 36. With the test system 30, the test apparatus 34 tests the DUT 36 which is an electronic device. The test control device 32 controls and instructs the test apparatus 34 to execute the test of the DUT 36. The test apparatus 34 provides a test signal to the DUT 36. At the same time, the test apparatus 34 compares multiple output signals, which are output from the DUT 36 in response to the test signal, with the respective anticipated values. Thus, the test apparatus 34 performs a test for determining whether or not the DUT 36 performs expected operation based on the comparison results. The DUT 36 generates the multiple output signals in response to the test signal provided from the test apparatus 34. The multiple output signals are each output via multiple pins provided to the DUT 36.

It is an object of the test apparatus 34 according to the third embodiment of the present invention to determine the acceptability of the DUT 36 with high precision, by testing the DCT 36 based on the timing correlation in which the multiple output signals change in correlation with one another, in addition to a conventional test of the DUT 36, like a function test using a conventional test apparatus, in which the multiple output signals are compared with the respective anticipated values independent of one another.

The test apparatus 34 comprises pattern generating means 300, timing generating means 310, waveform shaping means 320, a driver 330, reference timing detecting means 340, elapsed time detecting means 350, a comparator 360, setting means 370, anticipated value holding means 380, and determination means 390. The pattern generating means 300 generate a test signal pattern, which is to be provided to the DUT 36, under control of the test control device 32. The test signal pattern thus generated is output to the waveform shaping means 320. Furthermore, the pattern generating means 300 create information indicating the anticipated values of the output signals, which are to be output upon receiving the test signal according to the test signal pattern thus generated. The information thus created is output to the anticipated value holding means 380. The timing generating means 310 generate timing, at which the test signal is to be provided to the DUT 36, under control of the test control device 32. The information indicating the aforementioned timing is output to the waveform shaping means 320, the reference timing detecting means 340, and the anticipated value holding means 380.

The waveform shaping means 320 form the waveform of the test signal, which is to be provided to the DUT 36, based on the test signal pattern, which has been received from the pattern generating means 300, and which is to be provided to the DUT 36, and the information which has been received from the timing generating means 310, and which indicates the timing at which the test signal is to be provided to the DUT 36. The test signal thus formed is output to the driver 330. The driver 330 provides the test signal, which has been received from the waveform shaping means 320, to the DUT 36. Note that the test apparatus 34 may include multiple pin cards corresponding to multiple pins provided to the DUT 36. Furthermore, each pin card may include the driver 330. Such an arrangement allows these multiple pins to receive test signals different from one another. Subsequently, the DUT 36 generates multiple output signals corresponding to the test signal thus provided. The output signals thus generated are output to the reference timing detecting means 340, the elapsed time detecting means 350, and the comparator 360.

The reference timing detecting means 440 detect the change in one of the multiple output signals output from the DUT 36. For example, an arrangement may be made in which the reference timing detecting means 340 create multiple strobe signals, and acquire one of the output signals according to each of these multiple strobe signals. With such an arrangement, determination is made whether or not the value thus acquired has changed from the previously acquired value, thereby detecting the change in the particular one of these multiple output signals.

Then, the reference timing detecting means 340 output information indicating the timing at which the particular one output signal has changed, to the elapsed time detecting means 350.

In a case that of the multiple output signals output from the DUT 36, there is correlation between the timing of changing of one test signal and another test signal, the elapsed time detecting means 350 detect the elapsed time from the point in time at which the reference timing detecting means 340 have detected the change in the former output signal up to the point in time at which the latter output signal has changed.

For example, in a case that the reference timing detecting means 340 have detected the change in the former output signal, the elapsed timing detecting means 350 generate multiple strobe signals. Furthermore, the elapsed time detecting means 350 acquire the latter output signal according to each of the multiple strobe signals thus generated. Thus, the elapsed time detecting means 350 detect the timing at which the acquired value has changed from the previously-acquired value.

Subsequently, the elapsed time detecting means 350 calculate the period of time from the point in time at which the reference timing detecting means 340 have detected the change in the former output signal up to the point in time at which the latter output signal has changed, and employ the calculated period of time as the elapsed time.

Then, the elapsed time detecting means 350 output information indicating the elapsed time thus detected, to the determination means 390. The comparator 360 compares each of the output signals output from the DUT 36 with the corresponding reference voltage, and outputs the logical value, which indicates the comparison result, to the determination means 390.

In a case that of the multiple output signals output from the DUT 36, there is correlation between the timing of changing of one test signal and another test signal, the setting means 370 set, under control of the test control device 32 for example, a minimum time from the point in time at which the former output signal has changed up to the point in time at which the latter output signal has changed.

Then, the setting means 370 output information indicating the minimum time thus set, to the determination means 390. The anticipated value holding means 380 create the anticipated values of the output signals, which are to be output from the DUT 36 in response to the test signal, based on the information which has been received from the timing generating means 310, and which indicates the anticipated values, and the timing which has been received from the timing generating means 310, and at which the test signal is to be provided to the DUT 36. The anticipated value holding means 380 hold the anticipated values thus created beforehand.

The determination means 390 determine the acceptability of the DUT 36, which is an electronic device, based on the elapsed time received from the elapsed time detecting means 350, and the comparison result received from the comparator 360. Specifically, in a case that the elapsed time received from the elapsed time detecting means 350 is smaller than the minimum time received from the setting means 370, the determination means 390 determine that the DUT 36 is defective. Also, an arrangement may be made in which in a case that the logical values which have been received from the comparator 360, and which indicate the comparison results between the output signals and the reference voltages do not match the anticipated values held by the anticipated value holding means 380, the determination means 390 determine that the DUT 36 is defective.

Then, the notification means 390 output determination result whether or not the DUT 36 is acceptable, to the test control device 32, thereby notifying the user or the like of the determination result.

With the test apparatus 34 according to the third embodiment of the present invention, in a case that of the multiple output signals output from an electronic device, there is correlation of the timing at which these output signals change, the electronic device can be tested based on this correlation. Accordingly, even in the event that the values of the respective test signals at the predetermined timing match the values which they should assume, if the respective test signals do not satisfy a predetermined correlation, i.e., in the event that the period of time from the point in time at which one output signal changes up to the point in time at which another output signal is smaller than the predetermining minimum time, determination can be made that the electronic device is defective.

Conversely, even in the event that the output signal values do not match the respective anticipated value in a conventional function test, determination can be made that the electronic device is acceptable as long as the respective output signals satisfy a predetermined correlation due to the timing of change in the respective signals having been uniformly shifted. As described above, the test apparatus 34 offers higher-precision and more flexible electric-device test, as compared with a test apparatus configured so as to perform only a conventional function test.

Let us consider a case in which the DUT 36, which is an electronic device, provides output signals to another electronic device, and the latter electronic device operates according to the output signals thus received. In such a case, the minimum time may be set to either the setup time for one output signal or the hold time for another output signal.

Figure 6:
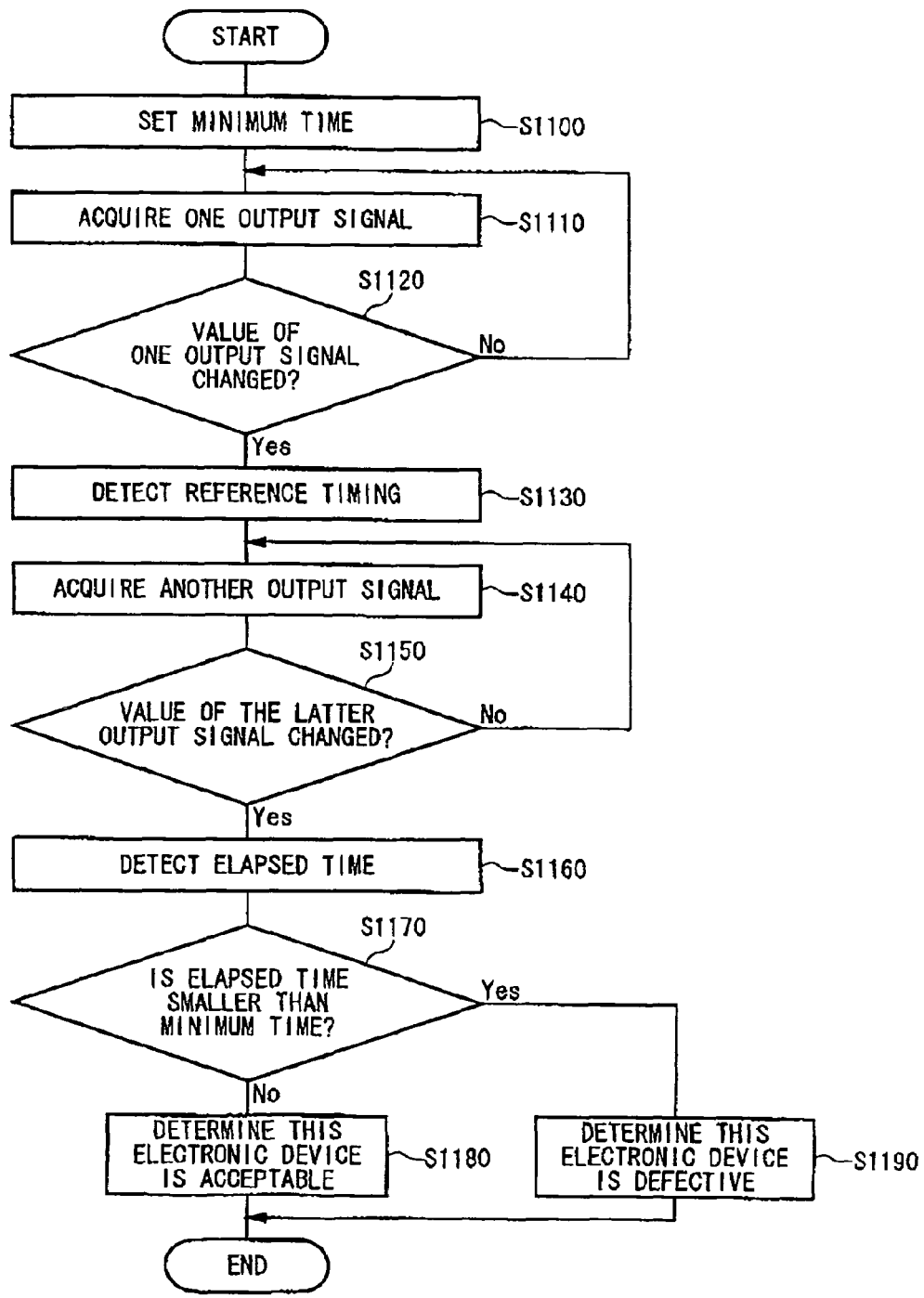
FIG. 6 is a flowchart which shows an example of the flow of processing with a test method for an electronic device using a test apparatus 34 according to the third embodiment of the present invention.

FIG. 6 is a flowchart which shows a flow of the processing with a test method for an electronic device using the test apparatus 34 according to the third embodiment of the present invention. First, the setting means 370 set beforehand the minimum time from the point in time at which one output signal of the multiple output signals output from the DUT 36 has changed up to the point in time at which another output signal has changed (S1100).

Subsequently, the reference timing detecting means 340 acquire the former output signal from among the multiple output signals which have been output from the DUT 36 in response to the test signal (S1110). Then, the reference timing detecting means 340 determine whether Or not the value of the former output signal thus acquired has changed from the previously-acquired value (S1120). In a case that the value of the former output signal has not changed (in a case of "NO" in Step S1120), the reference timing detecting means 340 returns the processing to Step S1110, and executes acquisition of the former output signal again.

On the other hand, in a case that the value of the former output signal has not changed (in a case of "NO" in Step S1120), the reference timing detecting means 340 detect the timing, at which the former output signal has changed, as a reference timing (S1130).

Subsequently, the elapsed time detecting means 350 acquire the latter output signal from among the multiple output signals which have been output from the DUT 36 in response to the test signal (S1140). Then, the elapsed time detecting means 350 determine whether or not the value of the latter output signal thus acquired has changed from the previously-acquired value (S1150). In a case that the value of the former output signal has not changed (in a case of "NO" in Step S1150), the flow returns to Step S1140, and the elapsed time detecting means 350 execute acquisition of the former output signal again. On the other hand, in a case that the value of the former output signal has changed (in a case of "YES" in Step S1150), the elapsed time detecting means 350 detect the elapsed time from the reference timing up to the point in time at which the value of the former output signal has changed (S1160). Subsequently, the determination means 390 determine whether or not the elapsed time thus detected is smaller than the preset minimum time (S1170). In a case that the elapsed time is not smaller than the minimum time (in a case of "NO" in Step S1170), the determination means 390 determine that the electronic device is acceptable (S1180). On the other hand, in a case that the elapsed time is smaller than the minimum time (in a case of "YES" in Step S1170), the determination means 390 determine that the electronic device is defective (S1190).

With the test method according to the third embodiment of the present invention, in a case that of the multiple output signals output from an electronic device, there is correlation of the timing at which these output signals change, the electronic device is tested based on this correlation. This offers a high-precision and more flexible test for determining whether or not the electronic device performs expected operation.

Also, by performing a test of an electronic device following the flow of the processing shown in the drawing, the electronic device can be manufactured with determination of whether or not the electronic device is acceptable or not being made with higher precision and more flexibility.

Figure 7:
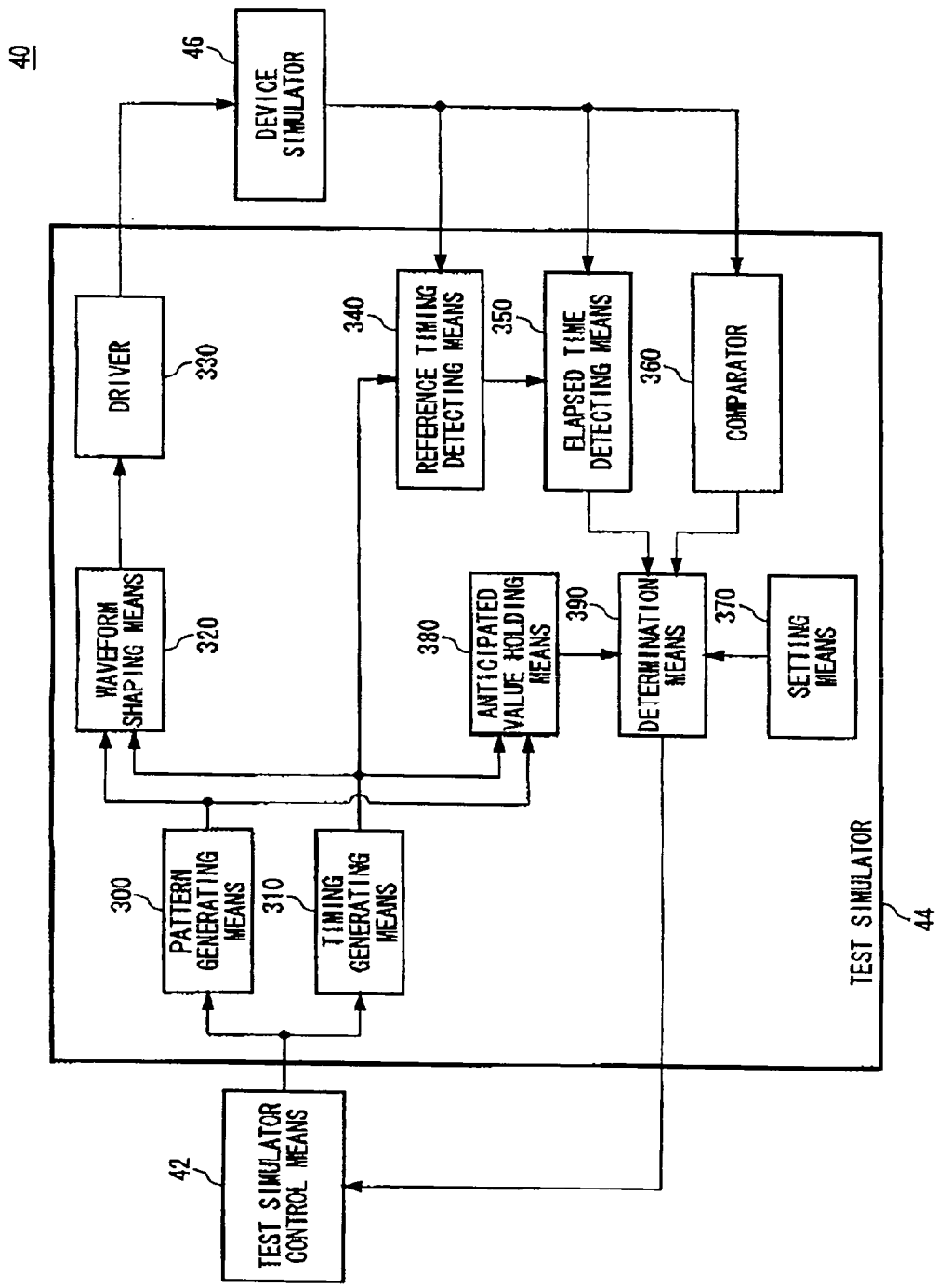
FIG. 7 is a block diagram which shows an example of the functional configuration of a test simulation system 40 according to a fourth embodiment of the present invention.

FIG. 7 is a block diagram which shows an example of a functional configuration of a test simulation system 40 according to a fourth embodiment of the present invention. The test simulation system 40 comprises test simulator control means 42, a test simulator 44, and a device simulator 46. The test simulator 44 simulates in a software manner the operations of the test apparatus 34 according to the third embodiment of the present invention, which has been described with reference to FIG. 5 and FIG. 6. Specifically, the test simulator 44 provides a test signal to the device simulator 46 for simulating the operations of an electronic device. At the same time, the test simulator 44 compares multiple output signals, which are output from the device simulator 46 in response to the test signal, with the respective anticipated values. Thus, the test simulator 44 performs a test for determining whether or not the electronic device performs expected operations.

The test simulator 44 comprises pattern generating means 300, timing generating means 310, waveform shaping means 320, a driver 330, reference timing detecting means 340, elapsed time detecting means 350, a comparator 360, setting means 370, anticipated value holding means 380, and determination means 390. Note that each of the components included in the test simulator 44 has generally the same function as that of the corresponding component included in the test apparatus 34 which is shown in FIG. 5, and which is denoted by the same reference numeral.

Note that each of the components included in the test simulator 44 operates by simulating the function of the corresponding component included in the test apparatus 34 in a software manner. With the present embodiment, the test simulator 44 is controlled by the test simulator control means 32 instead of the test control device 32. Furthermore, the device simulator 46, which simulates the electronic device by software, is tested instead of testing of the DUT 36 which is an actual electronic device. Thus, the electronic device is tested.

With the test simulator 44 according to the fourth embodiment of the present invention, in a case that of the multiple output signals output from the device simulator for simulating an electronic device, there is correlation in the timing at which these output signals change, the electronic device is tested based on this correlation. This offers a higher-precision and more flexible simulation test of an electronic device as compared with a test simulator configured so as to simulate a test apparatus for performing only a conventional function test.

Figure 8:
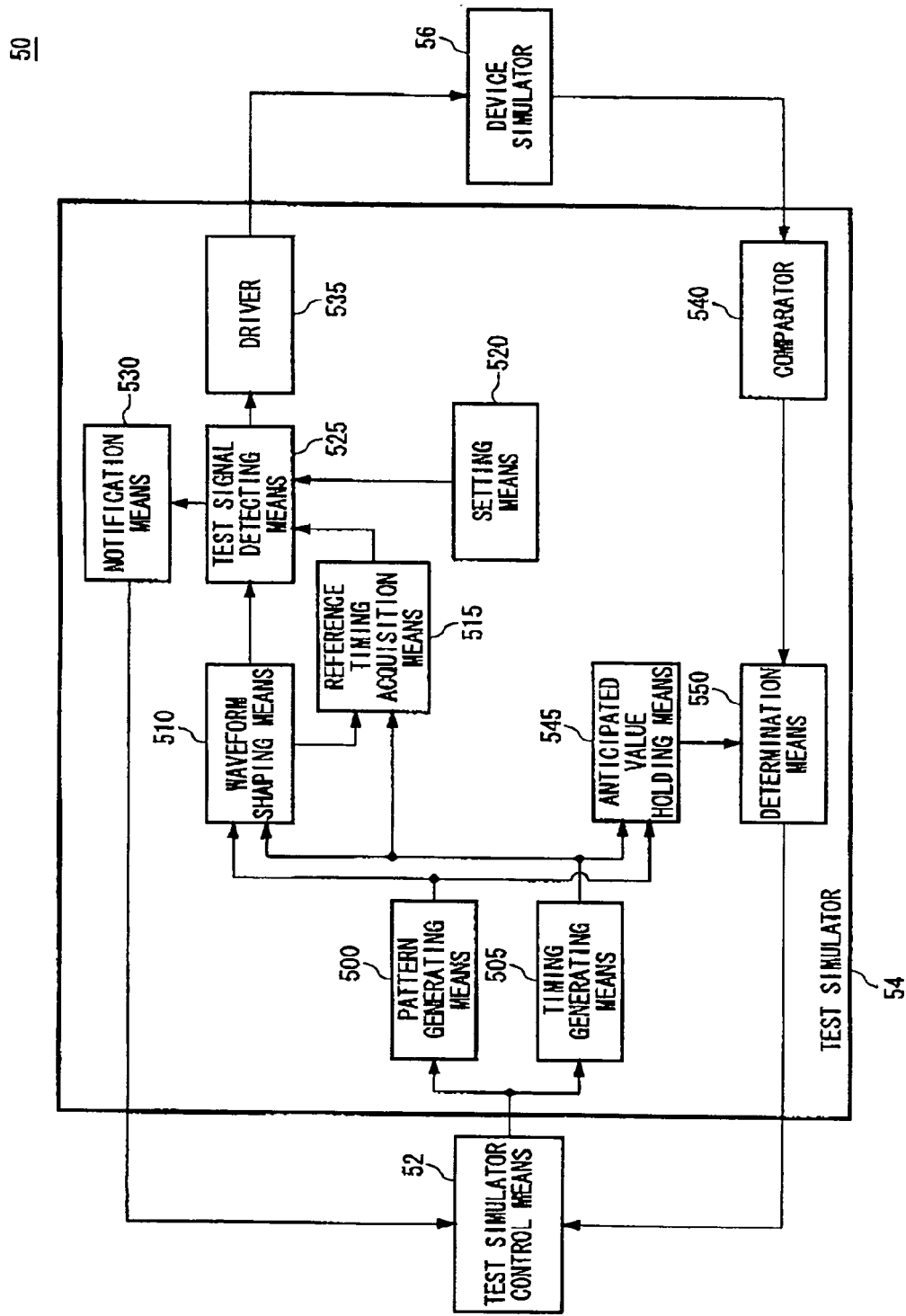
FIG. 8 is a block diagram which shows an example of the functional configuration of a test simulation system 50 according to a fifth embodiment of the present invention.

FIG. 8 is a block diagram illustrating au example of a functional configuration of a test simulation system 50 according to a fifth embodiment of the present invention. The test simulation system 50 has test simulator control means 52, a test simulator 54, and a device simulator 56. The test simulator 54 simulates the operations of a test apparatus for testing electronic devices using software. Specifically, the test simulator 54 provides multiple test signals to the device simulator 56 for simulating operations of an electronic device, and compares multiple output signals output from the device simulator 56 in accordance with the multiple test signals with respective anticipated values, thereby enabling testing of whether or not the electronic device can be correctly tested. That is to say, the test simulator 54 tests signals to be used for testing electronic devices, i.e., tests testing programs. The device simulator 56 simulates by software the operations of electronic devices which have multiple pins, and outputs multiple output signals in response to the multiple test signals which are provided from the test simulator 54, and which corresponds to the multiple pins.

It is an object of the test simulator 54 according to the fifth embodiment of the present invention to be able to test, with higher precision, whether or not an electronic device which the device simulator 56 simulates can be correctly tested using the multiple test signals, by testing the correlation in the timing of change of each of the test signals among the multiple test signals provided to the device simulator 56, Note that the multiple test signals of which the timing of change is correlated, to be described in the present embodiment may be, in a case of the devices simulator 56 simulating a DRAM for example, an address signal in a case of providing a signal specifying an address as an address signal, a RAS signal indicating the timing of inputting the address value which the address signal indicates as a row address, or a CAS signal indicating the timing of inputting the address value which the address signal indicates as a column address.

The test simulator 54 has pattern generating means 500, timing generating means 505, waveform shaping means 510, reference timing acquisition means 515, setting means 520, test signal detecting means 525, notification means 530, a driver 535, a comparator 540, anticipated value holding means 545, and determination means 550. The pattern generating means 500 generate patterns of test signals to be provided to the device simulator 56 under control of the test simulator control means 52, and output the generated test signal patterns to the waveform shaping means 510. Now, the pattern generating means 500 may generate multiple test signals corresponding to the multiple pins of the electronic device which the device simulator 56 simulates. Also, the pattern generating means 500 generate information indicating anticipated values of the output signals output by the device simulator 56 upon the test signals corresponding to a generated test signal pattern having been provided, and output the generated information to the anticipated value holding means 545.

The timing generating means 505 generate a timing at which a test signal is to be provided the device simulator 56, under control of the test simulator 56, and output the information indicating the timing to the waveform shaping means 510, reference timing acquisition means 515, and anticipated value holding means 545. The waveform shaping means 510 form multiple test signal waveforms to be provided to the device simulator 56, based on the test signal pattern to be provided to the device simulator 56 that has been received form the pattern generating means 500 and information indicating the timing for providing test signals to the device simulator 56 that has been received from the timing generating means 505, and output the formed multiple test signal waveforms to the reference timing acquisition means 515 and the test signal detecting means 525.

Based on the multiple test signals received form the waveform shaping means 510, the reference timing acquisition means 515 acquire a point in time at which one test signal changes. For example, the reference tinting acquisition means 515 repeatedly acquire the value of the one test signal at predetermined time intervals, detect change in the one test signal according to whether or not there has been change from the previously-acquired value, and acquire the point in time of detection. The reference timing acquisition means 515 then output information indicating the acquired point in time to the test signal detecting means 525.

In the event that of the multiple test signals output from the waveform shaping means 510, there is correlation between the timing of changing of one test signal and another test signal, the setting means 520 set beforehand the minimum time from change of the former test signal to the change of the latter test signal, under control of the test simulator control means 52, for example. The setting means 520 then output information indicating the minimum time that has been set, to the test signal detecting means 525

The test signal detecting means 525 receive, from the waveform shaping means 510, test signals to be provided to the device simulator 56. The test signal detecting means 525 then detect the value of the latter test signal at a timing after the minimum time set by the setting means 520 after the point in time at which the former test signal has changed, which has been acquired by the reference timing acquisition means 515.

The test signal detecting means 525 then output the value of the detected test signal to the notification means 530. Also, the test signal detecting means 525 output each of the test signals received from the waveform shaping means 510 to the driver 535.

The notification means 530 determine whether or not the test simulator 54 can correctly test the electronic device being simulated with the device simulator 56 using the current test signals, based on the value of the latter test signal detected by the test signal detecting means 525. Specifically, in the event that of the multiple test signals, there is correlation between the timing of changing of the former test signal and the latter test signal, but the value of the latter test signal detected by the test signal detecting means 525 does not match the value that has been stored beforehand as a value which the latter test signal should assume after the minimum time after the former test signal has changed, the notification means 530 determine that the electronic device cannot be correctly tested with the current test signals, and the test simulator control means 52 are notified to that effect. Now, a value stored beforehand as a value which the latter test signal should assume may be a value generated by the pattern generating means 500 under control of the test simulator control means 52 and stored beforehand in the notification means 530.

The driver 535 provides the multiple test signals received from the test signal detecting means 525 to the device simulator 56. The device simulator 56 generates output signals corresponding to the provided multiple test signals, and outputs the generated output signals to the comparator 540. The comparator 540 compares the output signals received from the device simulator 56 with a reference voltage, and outputs logical values, which are the comparison results, to the determination means 550. Note that in the event that the device simulator 56 outputs the output signals as logical values rather than analog values, the comparator 540 may output the received logical values to the determination means 550 without performing the above-described comparing processing.

The anticipated value holding means 545 generate an anticipated value for an output signal output from the device simulator 56 corresponding to the test signal, based on information indicating the anticipated value that has been received from the pattern generating means 500 and the timing at which the test signal is to be provided to the device simulator 56 that has been received from the timing generating means 505, and hold the generated anticipated value beforehand. The determination means 550 determine acceptability of the electronic device which the device simulator 56 is simulating, or the acceptability of the test program, based on the comparison results received from the comparator 540. Specifically, in the event that the logical value received form the comparator 540 indicating the comparison results between the output signal and the reference voltage does not match the anticipated value held in the anticipated value holding means 545, the determination means 550 determine that the electronic device or the test program is defective. The determination means 550 then output the acceptability determination results regarding the electronic device or test program to the test simulator control means 52, for presentation to the user or the like.

With the test simulator 54 according to the fifth embodiment of the present invention, in the event that there is correlation in the timing at which multiple test signals provided to the device simulator 56 simulating an electronic device change, testing regarding whether the electronic device can be correctly tested using these test signals can be performed based on this correlation. Accordingly, even in the event that the values of the respective test signals at the predetermined timing match the values which they should assume, if the respective test signals do not satisfy a predetermined correlation, i.e., in the event that the value of the latter test signal at the timing following which the preset minimum time has elapsed from the changing of the former test signal does not agree with the value which it should assume, determination can be made that these test signals cannot correctly test the electronic device. Conversely, even in the event that the values of the respective test signals at the predetermined timing do not match the values which they should assume, determination can be made that these test signals can correctly test the electronic device as long as the respective test signals satisfy a predetermined correlation of the timing of change in the respective signals due to the respective signals having been uniformly shifted. Thus, with the test simulator 54, whether or not testing of an electronic device can be correctly performed can be tested with higher precision and more flexibly than with test simulators which perform conventional simulation testing.

While description has been made with reference to FIG. 8 regarding the test simulator 54 which performs simulation of operations of a test apparatus for testing electronic devices using software, an arrangement may be made in which an actual test apparatus performs the same processing as that executed by the test simulator 54 as described above, instead of the aforementioned simulation test.

Specifically, the test apparatus may have pattern generating means 500, timing generating means 505, waveform shaping means 510, reference timing acquisition means 515, setting means 520, test signal detecting means 525, notification means 530, a driver 535, a comparator 540, anticipated value holding means 545, and determination means 550. Now, each of the components of the test apparatus have substantially identical functions as those of the components of the test simulator 54 shown in the drawing which are denoted with the same reference numerals. The test apparatus tests whether or not an electronic device performs expected operations by providing multiple test signals to an actual electronic device instead of the device simulator 56, and comparing the multiple output signals output from the electronic device corresponding to the multiple test signals with respective anticipated values. Furthermore, the test apparatus may test an electronic device under control of a test control device instead of the test simulator control means 52. In the event that there is correlation in the timing at which multiple test signals provided to an electronic device change, the test apparatus can test whether or not the electronic device can be correctly tested using the test signals, based on the correlation, by performing processing the same as the processing described as that of the test simulator 54 with reference to the drawing.

Figure 9:
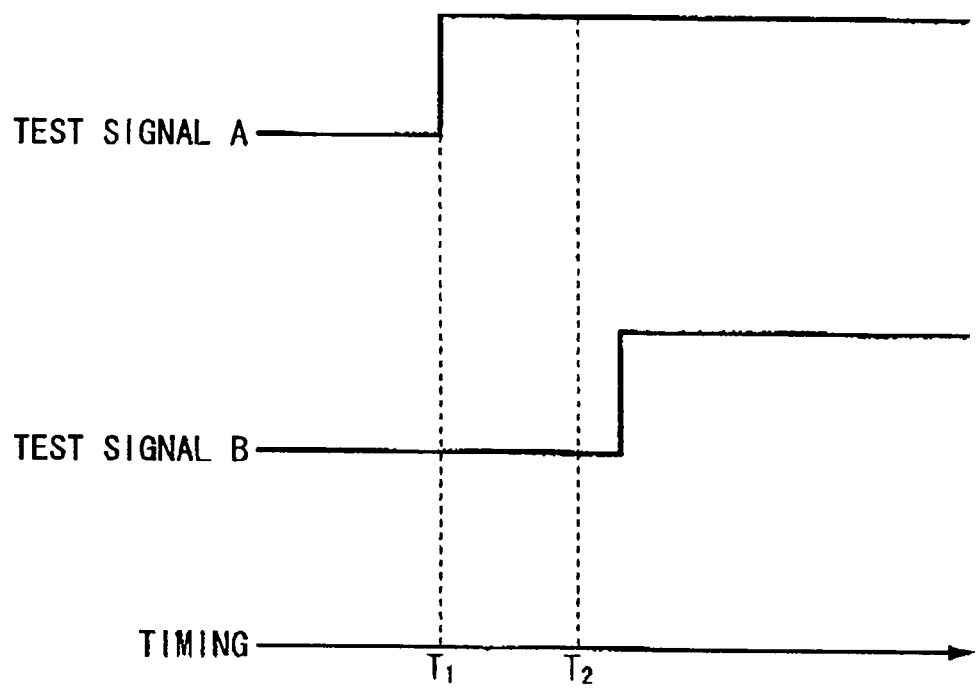
FIG. 9 is a diagram which shows an example of test signals used by a test simulator 54 according to the fifth embodiment of the present invention.

FIG. 9 illustrates an example of test signals used at the test simulator 54 according to the fifth embodiment of the present invention. Of the test signals shown in this drawing, the test signal A is the former test signal described with regard to FIG. 8. Also, the test signal B is the latter test signal described with regard to FIG. 8. Now, there is a correlation in the timing at which the test signal A and the test signal B change. For example, the test signal B does not change until the predetermined minimum time elapses following change of the test signal A. Note that in this drawing, the timing at which the test signal A changes is illustrated as timing T1, and the timing at which the minimum time, which has been set by the setting means 520, has elapsed from the timing T1 as timing T2.

Also, the value which the test signal B should assume at the timing T2 is a low logical value. Accordingly, in the event that the test signal B is at a high logical value at timing T2, the notification means 530 determine that the electronic device being simulated by the device simulator 56 cannot be correctly tested with the test signals shown in the drawing.

Now, the minimum time may be either the setup time of the former test signal, i.e., of the test signal A, or the hold time of the latter test signal, i.e., the hold time of the test signal B. Description will now be made regarding a specific example, wherein an address signal, and a RAS signal indicating the timing for input of the address value indicated by the address signal as a row address, are provided by the test simulator 54 as test signals to the device simulator 56 simulating a DRAM. In this case, in the event that the test signal A is an address and the test signal B is a RAS signal, the minimum time may be the setup time of the test signal A. Also, in the event that the test signal A is a RAS signal and the test signal B is an address signal, the minimum time may be the hold time of the test signal B for the electronic device which the device simulator 56 is simulating. Thus, determination can be made regarding whether or not the electronic device, which is simulated by the device simulator 56, can acquire the address signal in a sure manner. That is to say, determination can be made regarding whether or not the electronic device can be correctly tested using these test signals.

Figure 10:
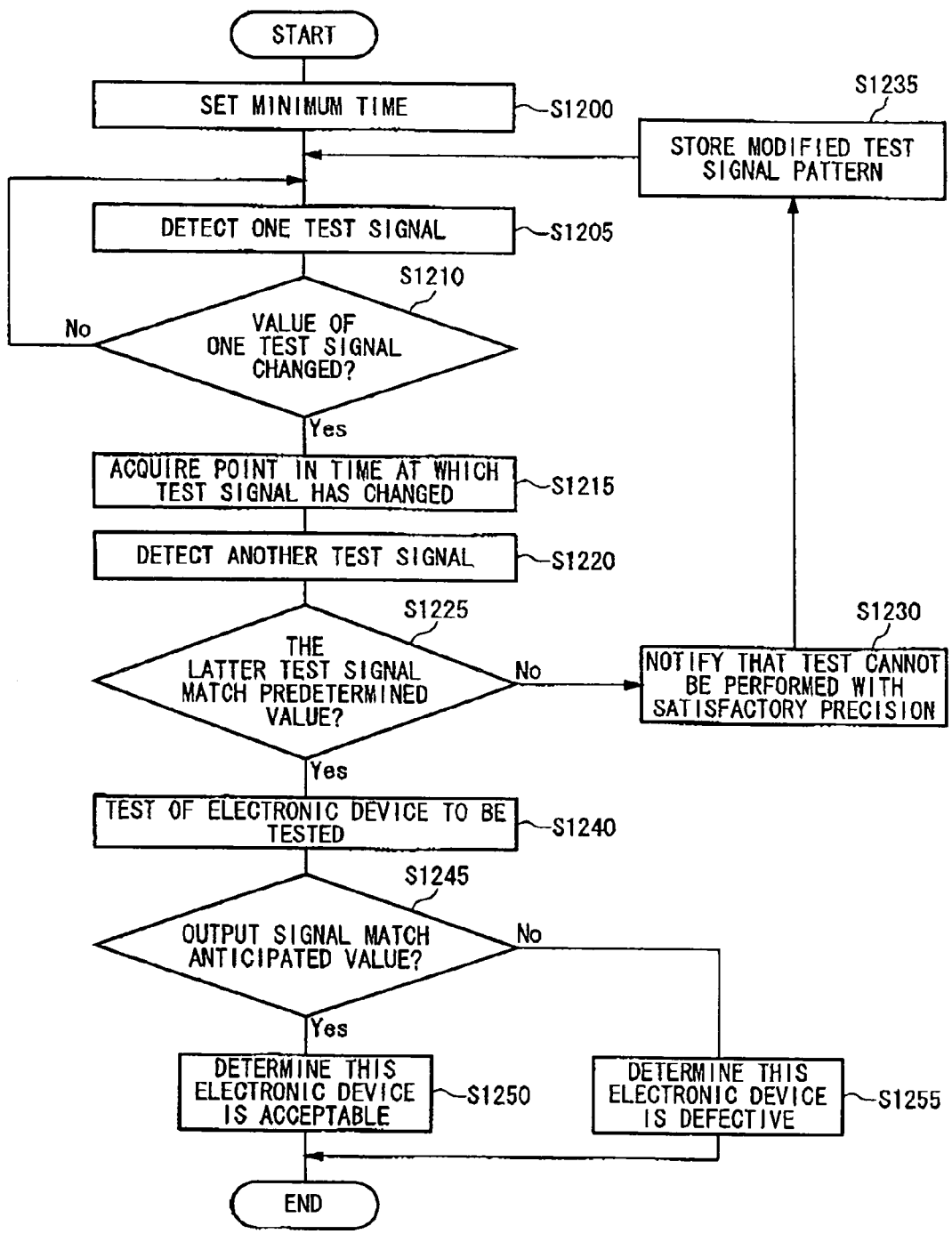
FIG. 10 is a flowchart which shows an example of the flow of processing with a test simulation method for an electronic device and a manufacturing method using the test simulation system 50 according to the fifth embodiment of the present invention.

FIG. 10 is a flowchart illustrating an example of the flow of processing with the electronic device test simulation method and manufacturing method using the test simulation system 50 according to the fifth embodiment of the present invention. First, the setting means 520 set the minimum time for one test signal of the multiple test signals changing up to another one test signal changing (S1200). Next, the reference timing acquisition means 515 detect, of the multiple test signals, the value of the former test signal (S1205). Here, the reference timing acquisition means 515 determine whether the value of the detected former test signal has changed from the previously-detected value (S1210) In the event that there is no change in the value of the former test signal (in a case of "No" in S1210), the reference timing acquisition means 515 return the processing to S1205, and the value of the former test signal is detected again. On the other hand, in the event that there is change in the value of the former test signal (in a case of "Yes" in S1210), the reference timing acquisition means 515 acquire the point in time of the change (S1215).

Next, the test signal detecting means 525 detect the value of the latter test signal at the timing where the set minimum time has elapsed from the point in time of change of the value of the former test signal (S1220). Next, the notification means 530 determine whether or not the value of the detected latter test signal matches the value which it should assume (S1225) In the event that the value of the latter test signal does not match the value which it should assume (in the case of "No" in S1225), the notification means 530 determine that the electronic device which the device simulator 56 is simulating cannot be correctly tested with these test signals, and makes notification to that effect (S1230). Next, the test simulator control means 52 prompt the user to modify the test signals by presenting the notification contents received form the notification means 530 thereto or the like, and stores the pattern of the modified test signals (S1235). The test simulation system 50 then returns the processing to S1205, to repeat the processing for acquiring the point in time, at which the former test signal changes, at the reference timing acquisition means 515 and the processing for detecting the value of the latter test signal at the test signal detecting means 525.

On the other hand, in the event that the value of the latter test signal matches the value which it should assume (in the case of "Yes" in S1225), an actual test apparatus tests an actual electronic device, which has been simulated by the device simulator 56, using these test signal patterns, instead of the test simulator 54 (S1240).

The test apparatus then determines whether or not the value of the output signal obtained from the electronic device by providing test signals to the actual test apparatus match the anticipated value of the output signal generated according to the test signal pattern (S1245). In the event that the value of the output signal matches the anticipated value (in the case of "Yes" in S1245), the test apparatus determines that the electronic device is acceptable (S1250). On the other hand, in the event that the value of the output signal does not match the anticipated value (in the case of "No" in S1245), the test apparatus determines that the electronic device is defective (S1255).

With the test simulation method according to the flow of processing from S1200 through S1230 in the drawing, in the event that there is correlation between the timing at which multiple test signals change, verifying the test signals based on the correlation thereof enables determination to be made regarding whether or not an electronic device can be correctly tested using the test signals. Also, even in the event that determination is made that the electronic device cannot be correctly tested, the user can generate, with high precision, a test signal pattern whereby the electronic device can be correctly tested, by repeatedly performing modification of the pattern and re-verification.

Also, by performing simulation testing and actual testing of the electronic device following the flow of the processing shown in the drawing, the electronic device can be manufactured with determination of whether or not the electronic device is acceptable or not being made with higher precision and more flexibility.

Figure 11:
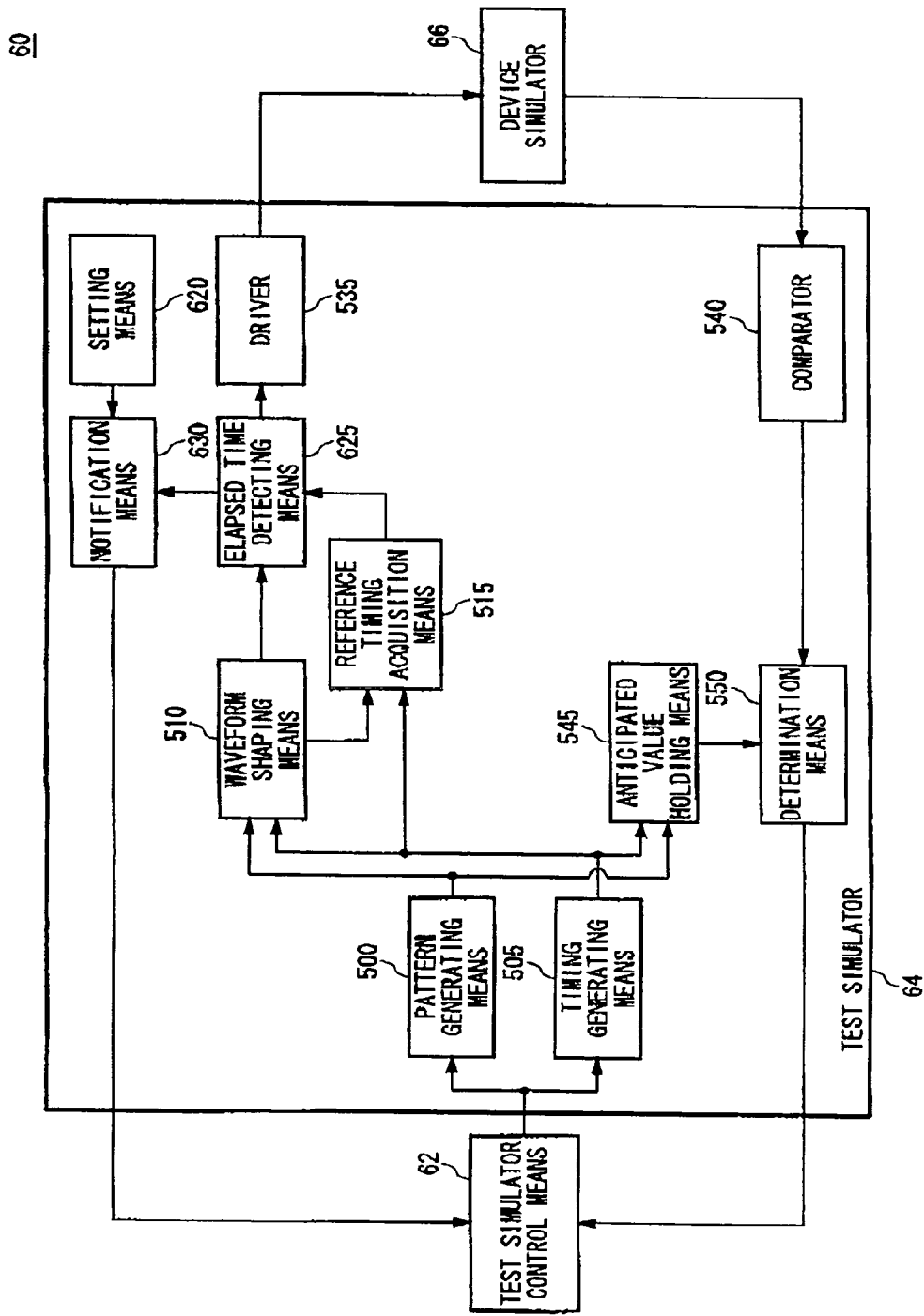
FIG. 11 is a block diagram which shows an example of the functional configuration of a test simulation system 60 according to a sixth embodiment of the present invention.

FIG. 11 is a block diagram illustrating an example of a functional configuration of a test simulation system 60 according to a sixth embodiment of the present invention. The test simulation system 60 has test simulator control means 62, a test simulator 64, and a device simulator 66. The test simulator 64 has pattern generating means 500, timing generating means 505, waveform shaping means 510, reference timing acquisition means 515, setting means 620, elapsed time detecting means 625, notification means 630, a driver 535, a comparator 540, anticipated value holding means 545, and determination means 550. Of the components of the test simulator 64, those denoted with the same reference numerals as the components of the test simulator 54 shown in FIG. 8 have substantially the same functions as the components of the test simulator 54, so description thereof will be omitted except for differences thereof. Note however, that with test simulator 64 operates under control of test simulator control means 62 instead of the test simulator control means 52, and tests a device simulator 66 instead of the device simulator 56.

In the event that of the multiple test signals output from the waveform shaping means 510, there is correlation between the timing of changing of one test signal and another test signal, the setting means 620 set beforehand the minimum time from change of the former test signal to the change of the latter test signal, under control of the test simulator control means 62, for example. The setting means 620 then output information indicating the minimum time that has been set, to the notification means 630.

The elapsed time detecting means 625 receive, from the waveform shaping means 510, test signals to be provided to the device simulator 66. The elapsed time detecting means 625 detect the amount of time elapsed from the point in time of one test signal changing that has been acquired by the reference timing acquisition means 515, to the time of another test signal changing. For example, the elapsed time detecting means 625 repeatedly acquire the value of the latter test signal at predetermined time intervals from the point in time of the former test signal changing, and detect change in the latter test signal according to whether or not there has been changed from the previously-acquired value. Subsequently, the elapsed time detecting means 625 detect the time elapsed from the point in time of the former test signal changing to the changing of the latter test signal, as the elapsed time. The elapsed time detecting means 625 then output information indicating the detected elapsed time to the notification means 630.

The notification means 630 determine whether or not the test simulator 64 can correctly test the electronic device being simulated with the device simulator 66 using the current test signals, based on the elapsed time received form the elapsed time detecting means 625. Specifically, in the event that the elapsed time is shorter than the minimum time received from the setting means 620, the notification means 630 determine that the electronic device cannot be correctly tested with the current test signals, and the test simulator control means 62 are notified to that effect.

With the test simulator 64 according to the sixth embodiment of the present invention, in the event that there is correlation in the timing at which multiple test signals provided to the device simulator 66 simulating an electronic device change, testing regarding whether the electronic device can be correctly tested using these test signals can be performed based on this correlation. Accordingly, even in the event that the values of the respective test signals at the predetermined timing match the values which they should assume, if the respective test signals do not satisfy a predetermined correlation, i.e., in the event that the elapsed time from the former test signal changing to the latter test signal changing is shorter than the minimum time set beforehand, determination can be made that these test signals cannot correctly test the electronic device. Conversely, even in the event that the values of the respective test signals at the predetermined timing do not match the values which they should assume, determination can be made that these test signals can correctly test the electronic device as long as the respective test signals satisfy a predetermined correlation due to the timing of change in the respective test signals having been uniformly shifted.

Thus, with the test simulator 64, whether or not testing of an electronic device can be correctly performed can be tested with higher precision and more flexibly than with test simulators which perform conventional simulation testing.

Now, the minimum time set by the setting means 620 may be either the setup time of the former test signal, or the hold time of the latter test signal.

While description has been made with reference to FIG. 11 regarding the test simulator 64 which performs simulation of operations of a test apparatus for testing electronic devices using software, processing the same as the processing for the above-described test simulator 64 may be applied to actual test apparatuss as well. Specifically, the test apparatus may have pattern generating means 500, timing generating means 505, waveform shaping means 510, reference timing acquisition means 515, setting means 620, elapsed time detecting means 625, notification means 630, a driver 535, a comparator 540, anticipated value holding means 545, and determination means 550. Now, each of the components of the test apparatus have substantially identical functions as those of the components of the test simulator 64 shown in the drawing which are denoted with the same reference numerals. The test apparatus tests whether or not an electronic device performs expected operations by providing multiple test signals to an actual electronic device instead of the device simulator 66, and comparing the multiple output signals output from the electronic device corresponding to the multiple test signals with respective anticipated values. Furthermore, the test apparatus may test an electronic device under control of a test control device instead of the test simulator control means 62. In the event that there is correlation in the timing at which multiple test signals provided to an electronic device change, the test apparatus can test whether or not the electronic device can be correctly tested using the test signals, based on the correlation, by performing processing the same as the processing described as that of the test simulator 64 with reference to the drawing.

Figure 12:
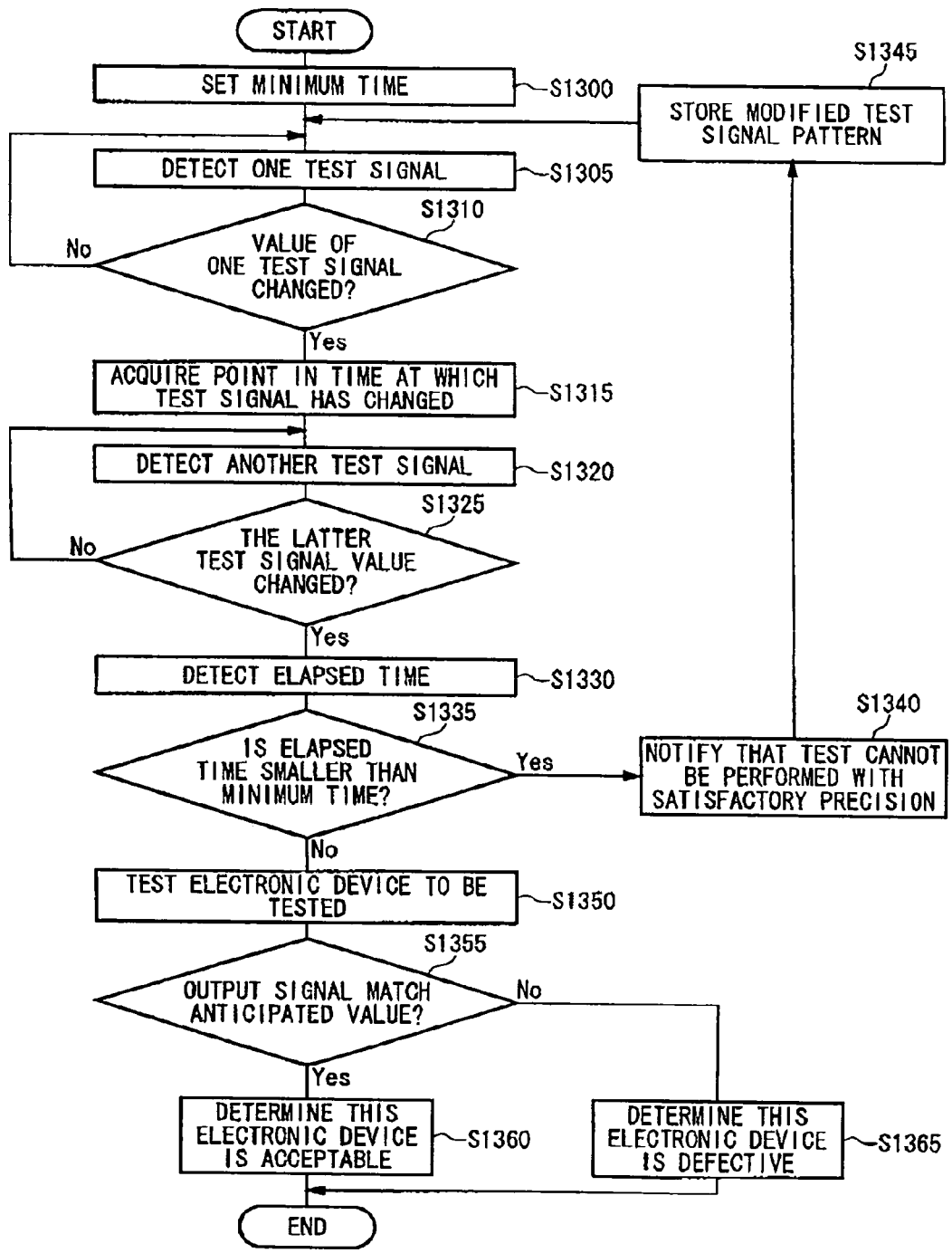
FIG. 12 is a flowchart which shows an example of the flow of processing with a test simulation method for an electronic device and a manufacturing method using the test simulation system 60 according to the sixth embodiment of the present invention.

FIG. 12 is a flowchart illustrating an example of the flow of processing with the electronic device test simulation method and manufacturing method using the test simulation system 60 according to the sixth embodiment of the present invention. First, the setting means 620 set the minimum time from the point in time at which one test signal of the multiple test signals has changed up to the point in time at which another one test signal has changed (S1300). Next, the reference timing acquisition means 515 detect, of the multiple test signals, the value of the former test signal (S1305). Here, the reference timing acquisition means 515 determine whether or not the value of the detected former test signal has changed from the previously-detected value (S1310) In the event that there is no change in the value of the former test signal (in a case of "No" in S1310), the reference timing acquisition means 515 return the processing to S1305, and the value of the former test signal is detected again. On the other hand, in the event that there is change in the value of the former test signal (in a case of "Yes" in S1310), the reference timing acquisition means 515 acquire the point in time of the change (S1315).

Next, the elapsed time detecting means 625 detect, of the multiple test signals, the value of the latter test signal (S1320). Here, the elapsed time detecting means 625 determine whether or not the value of the detected latter test signal has changed from the previously-detected value (S1325) In the event that there is no change in the value of the latter test signal (in the case of "No" in S1325), the elapsed time detecting means 625 return the processing to step S1320, and detect the value of the latter test signal again. In the event that there is change in the value of the latter test signal (in the case of "Yes" in S1325), the elapsed time detecting means 625 detect the elapsed time from the former test signal value changing to the latter test signal value changing (S1330). Now, the notification means 630 determine whether or not the detected elapsed time is shorter than the minimum time set beforehand (S1335). In the event that determination is made that the detected elapsed time is shorter than the minimum time (in the case of "Yes" in S1335), the notification means 530 determine that the electronic device being simulated by the device simulator 66 cannot be correctly tested with these signals, and makes notification to that effect (S1340). Next, the test simulator control means 62 prompt the user to modify the test signals by presenting the notification contents received form the notification means 630 thereto or the like, and stores the pattern of the modified test signals (S1345). The test simulation system 60 then returns the processing to S1305, to repeat the processing for acquiring the point in time at which the former test signal changes, which is performed by the reference timing acquisition means 515, and the processing for detecting the elapsed time, which is performed by the elapsed time detecting means 625.

On the other hand, in the event determination is made that the elapsed time is not shorter than the minimum time (in the case of "No" in S1335), an actual test apparatus tests an actual electronic device, which has been simulated by the device simulator 66, using these test signal patterns, instead of such a simulation (S1350).

The test apparatus then determines whether Or not the value of the output signal obtained from the electronic device by providing test signals to the actual test apparatus match the anticipated value of the output signal generated according to the test signal pattern (S1355). In the event that the value of the output signal matches the anticipated value (in the case of "Yes" in S1355), the test apparatus determines that the electronic device is acceptable (S1360). On the other hand, in the event that the value of the output signal does not match the anticipated value (in the case of "No" in S1355), the test apparatus determines that the electronic device is defective (S1365).

With the test simulation method according to the flow of processing from S1300 through S1340 in the drawing, in the event that there is correlation between the timing at which multiple test signals change, verifying the test signals based on the correlation thereof enables determination to be made regarding whether or not an electronic device can be correctly tested using the test signals. Also, even in the event that determination is made that the electronic device cannot be correctly tested, the user can generate a test signal pattern with high precision, which allows the electronic device to be correctly tested, by repeatedly performing modification of the pattern and re-verification.

Also, by performing simulation testing and actual testing of the electronic device following the flow of the processing shown in the drawing, the electronic device can be manufactured with determination of whether or not the electronic device is acceptable or not being made with higher precision and more flexibility.

Figure 13:
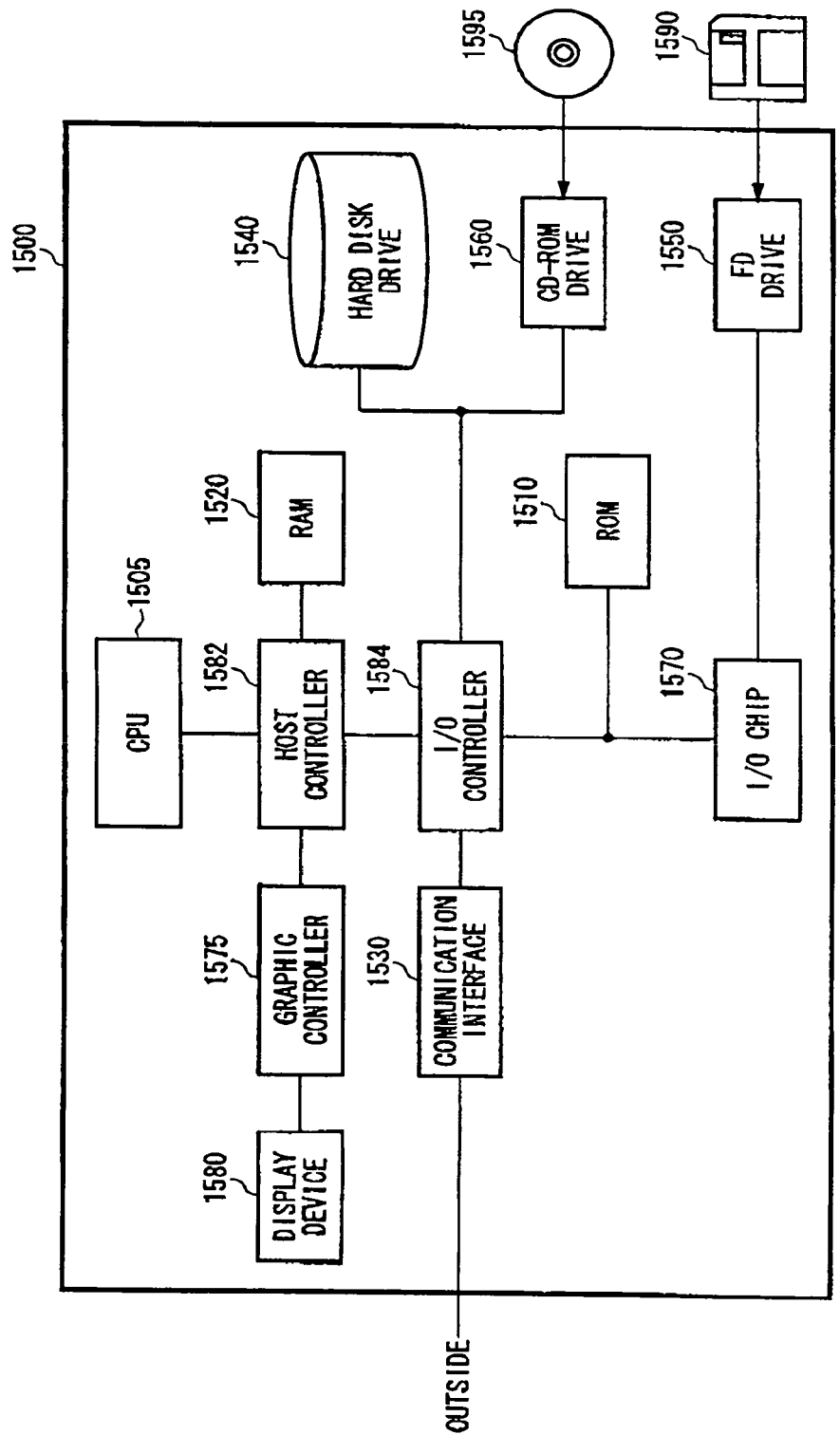
FIG. 13 is a block diagram which shows an example of a hardware configuration of a computer 1500 according to an embodiment of the present invention.

FIG. 13 is a block diagram illustrating an example of the hardware configuration of a computer 1500 according to an embodiment of the present invention. The computer 1500 according to an embodiment of the present invention comprises: a CPU 1505, and CPU peripherals including RAM 1520, a graphic controller 1575, and display device 1580, which are connected with each other by a host controller 1582; an input/output unit including a communication interface 1530, a hard disk drive 1540, and a CD-ROM drive 1560, connected to the host controller 1582 by an input/output controller 1584; and a legacy input/output unit including ROM 1510, a flexible disk drive 1550, and input/output chip 1570, connected to the input/output controller 1584.

The host controller 1582 connects the RAM 1520 with the CPU 1505, and the graphic controller 1575, which access the RAM 1520 at a high transfer rate. The CPU 1505 operates based on programs stored in the ROM 1510 and the RAM 1520, so as to control the respective components. The graphic controller 1575 acquires image data to be generated on a frame buffer which the CPU 1505 or the like has created within the RAM 1520, thereby displaying the image data on the display device 1580.

Alternately, the graphic controller 1575 may internally include a frame buffer for storing image data created by the CPU 1505 or the like.

The input/output controller 1584 connects the host controller 1582 with the relatively high-speed input/output devices, i.e., the communication interface 1530, hard disk drive 1540, and CD-ROM drive 1560. The communication interface 1530 communicates with other devices via network. The hard disk drive 1540 stores the programs and data which the CPU 1505 within the computer 1500 uses. The CD-ROM drive 1560 reads the programs and data form the CD-ROM 1595 and provides these to the hard disk drive 1540 via the RAM 1520.

Also connected to the input/output controller 1584 are the ROM 1510, flexible disk drive 1550, and input/output chip 1570, which are relatively slow-speed input/output devices. The ROM 1510 stores the boot program executed at the time of starting up the computer 1500, programs dependent on the hardware of the computer 1500, and so forth. The flexible disk drive 1550 reads programs or data from the flexible disk 1590 and provides these to the hard disk drive 1540 via the RAM 1520. The input/output chip 1570 connects the flexible disk drive 1550 and various types of input/output devices, via for example a parallel port, serial port, keyboard port, mouse port, or the like.

The test simulation program provided to the hard disk drive 1540 via the RAM 1520 is provided by the user, stored in a storage medium such as a flexible disk 1590, CD-ROM 1595, IC card, etc. The test simulation program is read out from the storage medium, installed in the hard disk drive 1540 of the computer 1500 via the RAM 1520, and is executed by the CPU 1505. The test simulation program is installed in the computer 1500 and executed therein, which instructs the CPU 1505 or the like to operate the computer 1500 as the test simulator (24, 44, 54, 64) described with reference to FIG. 1 through FIG. 12.

The program described above may be stored in an external storage medium. Examples of external storage media which may be used include, besides flexible disks 1590 and CD-ROMs 1595, optical storage media such as DVDs and PDs (Phase change Dual disks), magneto-optical storage media such as MDs, tape media, semiconductor media such as IC cards, and so forth. Also, an arrangement may be made wherein a storage device such as a hard disk or RAM or the like provided in a server system connected to a dedicated communication network or the Internet is used as the storage media, with the program being provided to the computer 1500 via the network.

While the present invention has been described thus by way of embodiments, the technical scope of the present invention is not restricted to the scope of the embodiments described above. Various modifications and improvements may be made to the above-described embodiments. It is to be clearly understood from the Claims that such modifications and improvements are also encompassed within the technical scope of the present invention.

As can be clearly understood from the above description, according to the present invention, performing testing regarding the correlation of the timing at which multiple output signals output from an electronic device change enables acceptability of the electronic device top be determined with higher precision.

What is claimed is:

1. A test apparatus which tests whether or not an electronic device performs expected operations, by providing test signals to said electronic device and comparing a plurality of output signals output from said electronic device corresponding to said test signals with respective anticipated values, said test apparatus comprising:

reference timing detecting means for detecting that one of said output signals has changed;

setting means for setting beforehand a minimum time from changing of said output signal to changing of another output signal;

acquisition means for acquiring the value of the latter output signal at a timing at which said minimum time has elapsed from detection of change of said former output signal by said reference timing detecting means; and determination means for determining said electronic device to be defective in the event that the value of the latter output signal acquired by said acquisition means does not match the value which said latter output signal should assume following elapsing of said minimum time, wherein the acquisition means comprises:

strobe generating means for generating a strobe signal at a timing at which said minimum time has elapsed from detection of change of said former output signal by said reference timing detecting means; and a comparator for acquiring said latter output signal according to said strobe signal.

2. The test apparatus according to claim 1, further comprising anticipated value holding means for holding beforehand, as said anticipated value, a value which said latter output signal should assume following elapsing of said minimum time from the changing of said former output signal.

3. The test apparatus according to claim 2, wherein said minimum time is either the setup time of said former output signal for another electronic device which receives said output signals from said electronic device and operates, or the hold time of said latter output signal.

4. A test method for testing whether or not an electronic device performs expected operations, by providing test signals to said electronic device and comparing a plurality of output signals output from said electronic device corresponding to said test signals with respective anticipated values, said method comprising:

a reference timing detecting step for detecting that one of said output signals has changed;

a setting step for setting beforehand a minimum time from changing of said output signal to changing of another output signal;

an acquisition step for acquiring the value of the latter output signal at a timing at which said minimum time has elapsed from detection of change of said former output signal in said reference timing detecting step; and a determination step for determining said electronic device to be defective in the event that the value of the latter output signal acquired in said acquisition step does not match the value which said latter output signal should assume following elapsing of said minimum time, wherein the acquisition step comprises;

a strobe generating step of generating a strobe signal at a timing at which said minimum time has elapsed from detection of change of said former output signal by the reference timing detecting step and of acquiring the latter output signal according to the strobe signal.

5. A manufacturing method of an electronic device wherein electronic devices performing expected operations are selectively manufactured, by providing test signals to said electronic device and comparing a plurality of output signals output from said electronic device corresponding to said test signals with respective anticipated values, said method comprising:

a reference timing detecting step for detecting that one of said output signals has changed;

a setting step for setting beforehand a minimum time from changing of said output signal to changing of another output signal;

an acquisition step for acquiring the value of the latter output signal at a timing at which said minimum time has elapsed from detection of change of said former output signal in said reference timing detecting step; and a determination step for determining said electronic device to he defective in the event that the value of the latter output signal acquired in said acquisition step does not match the value which said latter output signal should assume following elapsing of said minimum time, wherein the acquisition step comprises:

a strobe generating step of generating a strobe signal at a timing at which said minimum time has elapsed from detection of change of said former output signal by the reference timing detecting step and of acquiring the latter output signal according to the strobe signal.

6. A test simulator which tests whether or not an electronic device performs expected operations, by providing test signals to a device simulator which simulates the operations of an electronic device and comparing a plurality of output signals output from said device simulator corresponding to said test signals with respective anticipated values, said test simulator comprising:

reference timing detecting means for detecting that one of said output signals has changed;

setting means for setting beforehand a minimum time from changing of said output signal to changing of another output signal;

acquisition means for acquiring the value of the latter output signal at a timing at which said minimum time has elapsed from detection of change of said former output signal by said reference timing detecting means; and determination means for determining said electronic device to be defective in the event that the value of the latter output signal acquired by said acquisition means does not match the value which said latter output signal should assume following elapsing of said minimum time, wherein the acquisition means comprises:

strobe generating means for generating a strobe signal at a timing at which said minimum time has elapsed from detection of change of said former output signal by said reference timing detecting means; and a comparator for acquiring said latter output signal according to said strobe signal.

7. A test apparatus which tests whether or not an electronic device performs expected operations, by providing test signals to said electronic device and comparing a plurality of output signals output from said electronic device corresponding to said test signals with respective anticipated values, said test apparatus comprising:

reference timing detecting means for detecting that one of said output signals has changed;

setting means for setting beforehand a minimum time from changing of said output signal to changing of another output signal and for outputting information indicating the set minimum time;

elapsed time detecting means for detecting an elapsed time from said reference timing detecting means detecting change in said former output signal to said latter output signal changing and for outputting information indicating the detected elapsed time; and determination means for receiving the information indicating the set minimum time and the detected elapsed time and for determining said electronic device to be defective in the event that said detected elapsed time received from the elapsed time detecting means is shorter than said set minimum time received from the setting means.

8. A test method which tests whether or not an electronic device performs expected operations, by providing test signals to said electronic device and comparing a plurality of output signals output from said electronic device corresponding to said test signals with respective anticipated values, said method comprising:

a reference timing detecting step for detecting that one of said output signals has changed;

a setting step for setting beforehand a minimum time from changing of said output signal to changing of another output signal and for outputting information indicating the set minimum time;

an elapsed time detecting step for detecting an elapsed time from change in said former output signal being detected in said reference timing detecting step to said latter output signal changing and for outputting information indicating the detected elapsed time; and a determination step for receiving the information indicating the set minimum time and the detected elapsed time and for determining said electronic device to be defective in the event that said detected elapsed time received from the elapsed time detecting step is shorter than said set minimum time received from the setting step.

9. A manufacturing method of an electronic device wherein electronic devices performing expected operations are selectively manufactured, by providing test signals to said electronic device and comparing a plurality of output signals output from said electronic device corresponding to said test signals with respective anticipated values, said method comprising:

a reference timing detecting step for detecting that one of said output signals has changed;

a setting step for setting beforehand a minimum time from changing of said output signal to changing of another output signal and for outputting information indicating the set minimum time;

an elapsed time detecting step for detecting an elapsed time from change in said former output signal being detected in said reference timing detecting step to said latter output signal changing and for outputting information indicating the detected elapsed time; and a determination step for receiving the information indicating the set minimum time and the detected elapsed time and for determining said electronic device to be defective in the event that said detected elapsed time received from the elapsed time detecting step is shorter than said set minimum time received from the setting step.

10. A test simulator which tests whether or not an electronic device performs expected operations, by providing test signals to a device simulator which simulates the operations of an electronic device and comparing a plurality of output signals output from said device simulator corresponding to said test signals with respective anticipated values, said test simulator comprising:

reference timing detecting means for detecting that one of said output signals has changed;

setting means for setting beforehand a minimum time from changing of said output signal to changing of another output signal and for outputting information indicating the set minimum time;

elapsed time detecting means for detecting an elapsed time from said reference timing detecting means detecting change in said former output signal to said latter output signal changing and for outputting information indicating the detected elapsed time; and determination means for receiving the information indicating the set minimum time and the detected elapsed time and for determining said electronic device to be defective in the event that said detected elapsed time received from the elapsed time detecting means is shorter than said set minimum time received from the setting means.

11. A test apparatus which tests whether or not an electronic device can be correctly tested, by providing a plurality of test signals to said electronic device and comparing a plurality of output signals output from said electronic device corresponding to said plurality of test signals with respective anticipated values, said test apparatus comprising:

reference timing acquisition means for acquiring the point in time at which one of said output signals has changed;

setting means for setting beforehand a minimum time from changing of said output signal to changing of another output signal;

test signal detecting means for detecting the value of the latter test signal at the timing at which said minimum time has elapsed from the point in time of said former test signal changing that has been obtained by said reference timing acquisition means;

notification means for determining that said electronic device cannot be correctly tested in the event that the value of the latter test signal detected by said detecting means does not match a value stored beforehand as the value which said latter test signal should assume following elapsing of said minimum time, and making notification to that effect; and test means for testing the electronic device in the event that the value of the latter test signal detected by the detecting means matches the values stored beforehand as the value which the latter test signal should assume following elapsing of the minimum time.

12. A test simulator which tests whether or not an electronic device can be correctly tested, by providing a plurality of test signals to a device simulator simulating operations of an electronic device, and comparing a plurality of output signals output from said device simulator corresponding to said plurality of test signals with respective anticipated values, said test simulator comprising:

reference timing acquisition means for acquiring the point in time at which one of said output signals has changed;

setting means for setting beforehand a minimum time from changing of said output signal to changing of another output signal;

test signal detecting means for detecting the value of the latter test signal at the timing at which said minimum time has elapsed from the point in time of said former test signal changing that has been obtained by said reference timing acquisition means;

notification means for determining that said electronic device cannot be correctly tested in the event that the value of the latter test signal detected by said detecting means does not match a value stored beforehand as the value which said latter test signal should assume following elapsing of said minimum time, and making notification to that effect; and test means for testing the electronic device in the event that the value of the latter test signal detected by the detecting means matches the value stored beforehand as the value which the latter test signal should assume following elapsing of the minimum time.

13. A test simulation method which tests whether or not an electronic device can be correctly tested, by providing a plurality of test signals to a device simulator simulating operations of an electronic device, and comparing a plurality of output signals output from said device simulator corresponding to said plurality of test signals with respective anticipated values, said method comprising:

a reference timing acquisition step for acquiring the point in time at which one of said output signals has changed;

a setting step for setting beforehand a minimum time from changing of said output signal to changing of another output signal;

a test signal detecting step for detecting the value of the latter test signal at the timing at which said minimum time has elapsed from the point in time of said former test signal changing that has been obtained in said reference timing acquisition step;

a notification step for determining that said electronic device cannot be correctly tested in the event that the value of the latter test signal detected in said detecting step does not match a value stored beforehand as the value which said latter test signal should assume following elapsing of said minimum time, and making notification to that effect; and a test step for testing the electronic device in the event that the value of the latter test signal detected in the detecting step matches the values stored beforehand as the value which the latter test signal should assume following elapsing of the minimum time.

14. The simulation method according to claim 13, further comprising a storage step for storing a modified pattern of said test signals following said notification being performed in said notification step; wherein, following said storage step, said reference timing acquisition step and said test signal detecting step are executed again.

15. A manufacturing method of an electronic device, wherein whether or not an electronic device can be correctly tested is tested by providing a plurality of test signals to a device simulator simulating operations of the electronic device, and comparing a plurality of output signals output from said device simulator corresponding to said plurality of test signals with respective anticipated values, an actual electronic device is tested using the pattern of said test signals used for said test, and electronic devices performing expected operations are selectively manufactured, said method comprising:

a reference timing acquisition step for acquiring the point in time at which one of said output signals has changed;

a setting step for setting beforehand a minimum time from changing of said output signal to changing of another output signal;

a test signal detecting step for detecting the value of the latter test signal at the timing at which said minimum time has elapsed from the point in time of said former test signal changing that has been obtained in said reference timing acquisition step;

a notification step for determining that said electronic device cannot be correctly tested in the event that the value of the latter test signal detected in said detecting step does not match a value stored beforehand as the value which said latter test signal should assume following elapsing of said minimum time, and making notification to that effect;

a storage step for storing a modified pattern of said test signals following said notification being performed in said notification step;

a repetition step wherein, following said storage step, said reference timing acquisition step and said test signal detecting step are executed again;

an actual testing step wherein, in the event that the value of the latter test signal detected in said detecting step matches a value stored beforehand as the value which said latter test signal should assume following elapsing of said minimum time, an actual electronic device is tested using said modified test signal pattern; and a determination step for determining said electronic device to be acceptable in the event that the value of the output signal obtained from said electronic device in said actual testing step matches an anticipated value.

16. A test apparatus which tests whether or not an electronic device can be correctly tested, by providing a plurality of test signals to an electronic device and comparing a plurality of output signals output from said electronic device corresponding to said plurality of test signals with respective anticipated values, said test apparatus comprising:

reference timing acquisition means for acquiring the point in time at which one of said output, signals has changed;

setting means for setting beforehand a minimum time from changing of said output signal to changing of another output signal and for outputting information indicating the set minimum time;

elapsed time detecting means for detecting an elapsed time from said reference timing detecting means detecting change in said former output signal to said latter output signal changing and for outputting information indicating the detected elapsed time; and notification means for receiving the information indicating the set minimum time and the detected elapsed time and for determining that said electronic device cannot be correctly tested in the event that said detected elapsed time received from the elapsed time detecting means is shorter than said set minimum time received from the setting means, and making notification to that effect.

17. A test simulator which tests whether or not an electronic device can be correctly tested, by providing a plurality of test signals to a device simulator simulating the operations of an electronic device and comparing a plurality of output signals output from said device simulator corresponding to said plurality of test signals with respective anticipated values, said test simulator comprising:

reference timing acquisition means for acquiring the point in time at which one of said output signals has changed;

setting means for setting beforehand a minimum time from changing of said output signal to changing of another output signal and for outputting information indicating the set minimum time;

elapsed time detecting means for detecting an elapsed time from said reference timing acquisition means acquiring change in said former output signal to said latter output signal changing and for outputting information indicating the detected elapsed time; and notification means for receiving the information indicating the set minimum time and the detected elapsed time and for determining that said electronic device cannot be correctly tested in the event that said detected elapsed time received from the elapsed time detecting means is shorter than said set minimum time received from the setting means, and making notification to that effect.

18. A test simulating method which tests whether or not an electronic device can be correctly tested, by providing a plurality of test signals to a device simulator simulating the operations of an electronic device and comparing a plurality of output signals output from said device simulator corresponding to said plurality of test signals with respective anticipated values, said method comprising:
 a reference timing acquisition step for acquiring the point in time at which one of said output signals has changed;
 a setting step for setting beforehand a minimum time from changing of said output signal to changing of another output signal and for outputting information indicating the set minimum time;
 an elapsed time detecting step for detecting an elapsed time from change being acquired in said former output signal in said reference timing acquisition step to said latter output signal changing and for outputting information indicating the detected elapsed time; and
 a notification step for receiving the information indicating the set minimum time and the detected elapsed time and for determining that said electronic device cannot be correctly tested in the event that said detected elapsed time received from the elapsed time detecting step is shorter than said set minimum time received from the selling step, and making notification to that effect.

19. The simulation method according to claim 18, further comprising a storage step for storing a modified pattern of said test signals following said notification being performed in said notification step; wherein, following said storage step, said reference timing acquisition step and said elapsed time detecting step are executed again.

20. The test simulating method according to claim 18, wherein a test step of testing the electronic device is carried out in the event that the elapsed time is not shorter than the minimum time.

21. A manufacturing method of an electronic device, wherein whether or not an electronic device can be correctly tested is tested by providing a plurality of test signals to a device simulator simulating operations of the electronic device, and comparing a plurality of output signals output from said device simulator corresponding to said plurality of test signals with respective anticipated values, an actual electronic device is tested using the pattern of said test signals used for said test, and electronic devices performing expected operations are selectively manufactured, said method comprising:
 a reference timing acquisition step for acquiring the point in time at which one of said output signals has changed;
 a setting step for setting beforehand a minimum time from changing of said output signal to changing of another output signal;
 an elapsed time detecting step for detecting the elapsed time from changing of said former output signal being acquired in said reference timing acquisition step to said latter output signal changing;
 a notification step for determining that said electronic device cannot be correctly tested in the event that said elapsed time is shorter than said minimum time, and making notification to that effect;
 a storage step for storing a modified pattern of said test signals following said notification being performed in said notification step;
 a repetition step wherein, following said storage step, said reference timing acquisition step and said test signal detecting step are executed again;
 an actual testing step wherein, in the event that the value of the latter test signal detected in said detecting step matches a value stored beforehand as the value which said latter test signal should assume following elapsing of said minimum time, an actual electronic device is tested using said modified test signal pattern; and
 a determination step for determining said electronic device to be acceptable in the event that the value of the output signal obtained from said electronic device in said actual testing step matches an anticipated value.

22. A test apparatus which tests whether or not an electronic device performs expected operations, by providing test signals to said electronic device and comparing a plurality of output signals output from said electronic device corresponding to said test signals with respective anticipated values, said test apparatus comprising:
 a reference timing detecting unit for detecting that one of said output signals has changed;
 a setting unit for setting beforehand a minimum time from changing of said output signal to changing of another output signal;
 an acquisition unit for acquiring the value of the latter output signal at a timing at which said minimum time has elapsed from detection of change of said former output signal by said reference timing detecting unit; and
 a determination unit for determining said electronic device to be defective in the event that the value of the latter output signal acquired by said acquisition unit does not match the value which said latter output signal should assume following elapsing of said minimum time,
 wherein the acquisition unit comprises:
  a strobe generating unit for generating a strobe signal at a timing at which said minimum time has elapsed from detection of change of said former output signal by said reference timing detecting unit; and
  a comparator for acquiring said later output signal according to said strobe signal.

23. A test simulator which tests whether or not an electronic device performs expected operations, by providing test signals to a device simulator which simulates the operations of an electronic device and comparing a plurality of output signals output from said device simulator corresponding to said test signals with respective anticipated values, said test simulator comprising:
 a reference timing detecting unit for detecting that one of said output signals has changed;
 a setting unit for setting beforehand a minimum time from changing of said output signal to changing of another output signal;
 an acquisition unit for acquiring the value of the latter output signal at a timing at which said minimum time has elapsed from detection of change of said former output signal by said reference timing detecting unit; and
 a determination unit for determining said electronic device to be defective in the event that the value of the latter output signal acquired by said acquisition unit does not match the value which said latter output signal should assume following elapsing of said minimum time,
 wherein the acquisition unit comprises:
  a strobe generating unit for generating a strobe signal at a timing at which said minimum time has elapsed from detection of change of said former output signal by said reference timing detecting unit; and a comparator for acquiring said latter output signal according to said strobe signal.

24. A test apparatus which tests whether or not an electronic device performs expected operations, by providing test signals to said electronic device and comparing a plurality of output signals output from said electronic device corresponding to said test signals with respective anticipated values, said test apparatus comprising:
reference timing detecting unit for detecting that one of said output signals has changed;
a setting unit for setting beforehand a minimum time from changing of said output signal to changing of another output signal and for outputting information indicating the set minimum time;
an elapsed time detecting unit for detecting an elapsed time from said reference timing detecting unit detecting change in said former output signal to said latter output signal changing and for outputting information indicating the detected elapsed time; and
a determination unit for receiving the information indicating the set minimum time and the detected elapsed time and determining said electronic device to be defective in the event that said detected elapsed time received from the elapsed time detecting unit is shorter than said set minimum time received from the setting unit.

25. A test simulator which tests whether or not an electronic device performs expected operations, by providing test signals to a device simulator which simulates the operations of an electronic device and comparing a plurality of output signals output from said device simulator corresponding to said test signals with respective anticipated values, said test simulator comprising:
a reference timing detecting unit for detecting that one of said output signals has changed;
a setting unit for selling beforehand a minimum time from changing of said output signal to changing of another output signal and for outputting information indicating the set minimum time;
an elapsed time detecting unit for detecting an elapsed time from said reference timing detecting unit detecting change in said former output signal to said latter output signal changing and for outputting information indicating the detected elapsed time; and
a determination unit for receiving the information indicating the set minimum time and the detected elapsed time and for determining said electronic device to be defective in the event that said detected elapsed time received from the elapsed time detecting unit is shorter than said set minimum time received from the setting unit.

26. A test apparatus which tests whether or not an electronic device can be correctly tested, by providing a plurality of test signals to said electronic device and comparing a plurality of output signals output from said electronic device corresponding to said plurality of test signals with respective anticipated values, said test apparatus comprising:
a reference timing acquisition unit for acquiring the point in time at which one of said output signals has changed;
a setting unit for setting beforehand a minimum time from changing of said output signal to changing of another output signal;
a test signal detecting unit for detecting the value of the latter test signal at the timing at which said minimum time has elapsed from the point in time of said former test signal changing that has been obtained by said reference timing acquisition unit;
a notification unit for determining that said electronic device cannot be correctly tested in the event that the value of the latter test signal detected by said detecting unit does not match a value stored beforehand as the value which said latter test signal should assume following elapsing of said minimum time, and making notification to that effect; and
a test unit for testing the electronic device in the event that the value of the latter test signal detected by the detecting unit matches the value stored beforehand as the value which the latter test signal should assume following elapsing of the minimum time.

27. A test simulator which tests whether or not an electronic device can be correctly tested, by providing a plurality of test signals to a device simulator simulating operations of an electronic device, and comparing a plurality of output signals output from said device simulator corresponding to said plurality of test signals with respective anticipated values, said test simulator comprising:
a reference timing acquisition unit for acquiring the point in time at which one of said output signals has changed;
a setting unit for setting beforehand a minimum time from changing of said output signal to changing of another output signal;
a test signal detecting unit for detecting the value of the latter test signal at the timing at which said minimum time has elapsed from the point in time of said former test signal changing that has been obtained by said reference timing acquisition unit;
a notification unit for determining that said electronic device cannot be correctly tested in the event that the value of the latter test signal detected by said detecting unit does not match a value stored beforehand as the value which said latter test signal should assume following elapsing of said minimum time, and making notification to that effect; and
a test unit for testing the electronic device in the event that the value of the latter test signal detected by the detecting unit matches the value stored beforehand as the value which the latter test signal should assume following elapsing of the minimum time.

28. A test apparatus which tests whether or not an electronic device can be correctly tested, by providing a plurality of test signals to an electronic device and comparing a plurality of output signals output from said electronic device corresponding to said plurality of test signals with respective anticipated values, said test apparatus comprising:
a reference timing acquisition unit for acquiring the point in time at which one of said output signals has changed;
a setting unit for setting beforehand a minimum time from changing of said output signal to changing of another output signal and for outputting information indicating the set minimum time;
an elapsed time detecting unit for detecting an elapsed time from said reference timing acquisition unit acquiring change in said former output signal to said latter output signal changing and for outputting information indicating the detected elapsed time; and
a notification unit for receiving the information indicating the set minimum time and the detected elapsed time and for determining that said electronic device cannot be correctly tested in the event that said detected elapsed time received from the elapsed time detecting unit is shorter than said set minimum time received from the setting unit, and making notification to that effect.

29. A test simulator which tests whether or not an electronic device can be correctly tested, by providing a plurality of test signals to a device simulator simulating the operations of an electronic device and comparing a plurality of output signals output from said device simulator corresponding to said plurality of test signals with respective anticipated values, said test simulator comprising:

a reference timing acquisition unit for acquiring the point in time at which one of said output signals has changed;

a setting unit for setting beforehand a minimum time from changing of said output signal to changing of another output signal and for outputting information indicating the set minimum time;

an elapsed time detecting unit for detecting an elapsed time from said reference timing acquisition unit acquiring change in said former output signal to said latter output signal changing and for outputting information indicating the detected elapsed time; and a notification unit for receiving the information indicating the set minimum time and the detected elapsed time and for determining that said electronic device cannot be correctly tested in the event that said detected elapsed time received from the elapsed time detecting unit is shorter than said set minimum time received from the setting unit, and making notification to that effect.

* * * * *